United States Patent
Hoyt et al.

(10) Patent No.: US 9,835,698 B2
(45) Date of Patent: Dec. 5, 2017

(54) DEVICES AND PROCESS FOR HIGH-PRESSURE MAGIC ANGLE SPINNING NUCLEAR MAGNETIC RESONANCE

(71) Applicant: Battelle Memorial Institute, Richland, WA (US)

(72) Inventors: David W. Hoyt, Richland, WA (US); Jesse A. Sears, Kennewick, WA (US); Romulus V. F. Turcu, Richland, WA (US); Kevin M. Rosso, West Richland, WA (US); Jian Zhi Hu, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 904 days.

(21) Appl. No.: 14/165,215

(22) Filed: Jan. 27, 2014

(65) Prior Publication Data

US 2014/0139220 A1  May 22, 2014

Related U.S. Application Data

(62) Division of application No. 13/193,172, filed on Jul. 28, 2011, now Pat. No. 8,692,548.

(60) Provisional application No. 61/422,599, filed on Dec. 13, 2010.

(51) Int. Cl.
*G01R 33/30* (2006.01)
*G01R 33/34* (2006.01)

(52) U.S. Cl.
CPC ......... *G01R 33/307* (2013.01); *G01R 33/305* (2013.01); *G01R 33/34069* (2013.01)

(58) Field of Classification Search
CPC .............. G01R 33/305; G01R 33/307; G01R 33/34069
See application file for complete search history.

(56) References Cited

U.S. PATENT DOCUMENTS

| 3,585,973 | A |   | 6/1971 | Klover |
|---|---|---|---|---|
| 4,538,640 | A |   | 9/1985 | Acker |
| 4,657,009 | A |   | 4/1987 | Zen |
| 5,099,814 | A |   | 3/1992 | Ament |
| 5,325,059 | A | * | 6/1994 | Doty ............... G01R 33/307 324/321 |
| 5,517,856 | A | * | 5/1996 | Hofmann ............ G01R 33/30 324/321 |
| 5,542,379 | A |   | 8/1996 | Kessler |
| 5,760,586 | A |   | 6/1998 | Foerster et al. |

(Continued)

FOREIGN PATENT DOCUMENTS

| JP | 58-167947 | 10/1983 |
|---|---|---|
| JP | 2008-298469 | 12/2008 |

OTHER PUBLICATIONS

Janssen, H. et al., Microcoil High-Resolution Magic Angle Spinning MMR Spectroscopy, J. Am. Chem. Soc., 128, 2006, 8722-8723.

(Continued)

*Primary Examiner* — Dixomara Vargas
(74) *Attorney, Agent, or Firm* — Wells St. John P.S.

(57) ABSTRACT

A high-pressure magic angle spinning (MAS) rotor is detailed that includes a high-pressure sample cell that maintains high pressures exceeding 150 bar. The sample cell design minimizes pressure losses due to penetration over an extended period of time.

22 Claims, 14 Drawing Sheets

(56) References Cited

U.S. PATENT DOCUMENTS

| | | | | |
|---|---|---|---|---|
| 6,054,857 | A * | 4/2000 | Doty | G01R 33/307 324/321 |
| 6,714,138 | B1 * | 3/2004 | Turner | E21B 47/18 340/854.3 |
| 6,803,764 | B2 * | 10/2004 | Hioka | G01R 33/307 324/318 |
| 6,868,906 | B1 | 3/2005 | Vail et al. | |
| 7,287,416 | B1 * | 10/2007 | Bi | G01N 11/14 73/54.23 |
| 7,325,606 | B1 | 2/2008 | Vail et al. | |
| 7,412,877 | B1 * | 8/2008 | Bi | G01N 11/14 73/54.23 |
| 7,836,950 | B2 | 11/2010 | Vail et al. | |
| 7,845,212 | B1 * | 12/2010 | Bi | G01N 15/04 73/61.63 |
| 7,881,155 | B2 | 2/2011 | Close | |
| 8,467,268 | B2 | 6/2013 | Close | |
| 8,692,548 | B2 * | 4/2014 | Hoyt | G01R 33/305 324/307 |
| 8,813,542 | B1 * | 8/2014 | Bi | G01N 11/14 73/54.23 |
| 9,151,813 | B2 * | 10/2015 | Hu | B23G 1/02 |
| 9,366,736 | B2 * | 6/2016 | Cho | G01R 33/307 |
| 2006/0220647 | A1 | 10/2006 | Doty | |

OTHER PUBLICATIONS

Sakellariou, D., et al., High-resolution, high-sensitivity NMR of nanolitre anistropic samples by coil spinning, Nature, 447, 2007, 694-698.

Bloch, F., et al., Nuclear Induction, Phys. Rev., 69, 1946, 127.

Purcell, E. M., et al., Resonance Absorption by Nuclear Magnetic Moments in a a Solid, Phys. Rev. 29, 1946, p. 37.

Andrew, E. R., et al., Nuclear Magnetic Resonance Spectra from a Crystal rotated at High Speed, Nature 182, 1959.

Lowe, I. J., Free Induction Decays of Rotating Solids, Phys. Rev. Lett, 2, 1959, p. 285.

Miyoshi, T., et al., 13C High-Pressure CPMAS NMR Characterization of the Molecular Motion of Polystyrene Plasticized by CO2 Gas, Macromolecules, 30, 1997, 6582-6586.

Miyoshi, T., et al., Effects of Xe Gas on Segmental Motion in a Polymer Blend as Studied by 13C and 129Xe High-Pressure MAS NMR, Macromolecules, 35, 2002, 151-154.

Miyoshi, T., et al., 192Xe NMR Study of Free Volume and Phase Separation of the Polystyrene/poly(vinyl methyl ether) Blend, Polymer, 38, 21, 1997, 5475-5480.

Deuchande, T., et al., Design and Performance of a High Pressure Insert for Use in a Standard Magic Angle Spinning NMR Probe, Journal of Magnetic Resonance, 183, 2006, 178-182.

Bai, S., et al., A New High Pressure Sapphire Nuclear Magnetic Resonance Cell, Rev. of Sci. Instrum., 67, 1, 1996, 240-243.

High Pressure Generator, High Pressure Equipment Company, Erie, PA, 16505, 11.1-11.9.

Rasul, G., et al., Carbonic Acid and Its Mono- and Diprotonation: NMR, ab Inito, and IGLO Investigation, J. Am. Chem. Soc., 115, 1993, 2235-2238.

Kwak, J. H., et al., Metal Carbonation of Forsterite in Supercritical CO2 and H2O Using Solid State 29Si, 13C NMR Spectroscopy, J. Phys. Chem. C, 114, 2010, 4126-4134.

WO PCT/US2011/052604 IPRP, dated Jun. 18, 2013, Battelle Memorial Institute.

WO PCT/US2011/052604 Partial SR, dated Feb. 1, 2012, Battelle Memorial Institute.

WO PCT/US2011/052604 Search Rept, dated Mar. 27, 2013, Battelle Memorial Institute.

WO PCT/US2011/052604 Writ Opin, dated Mar. 27, 2013, Battelle Memorial Institute.

Hoyt et al., "High-Pressure Magic Angle Spinning Nuclear Magnetic Resonance", Journal of Magnetic Resonance vol. 212, 2011, United States, pp. 378-385.

Yonker et al., "The Use of Supercritical Fluids as Solvents for NMR Spectroscopy", Progress in Nuclear Magnetic Resonance Spectroscopy vol. 47, 2005, United States, pp. 95-109.

* cited by examiner

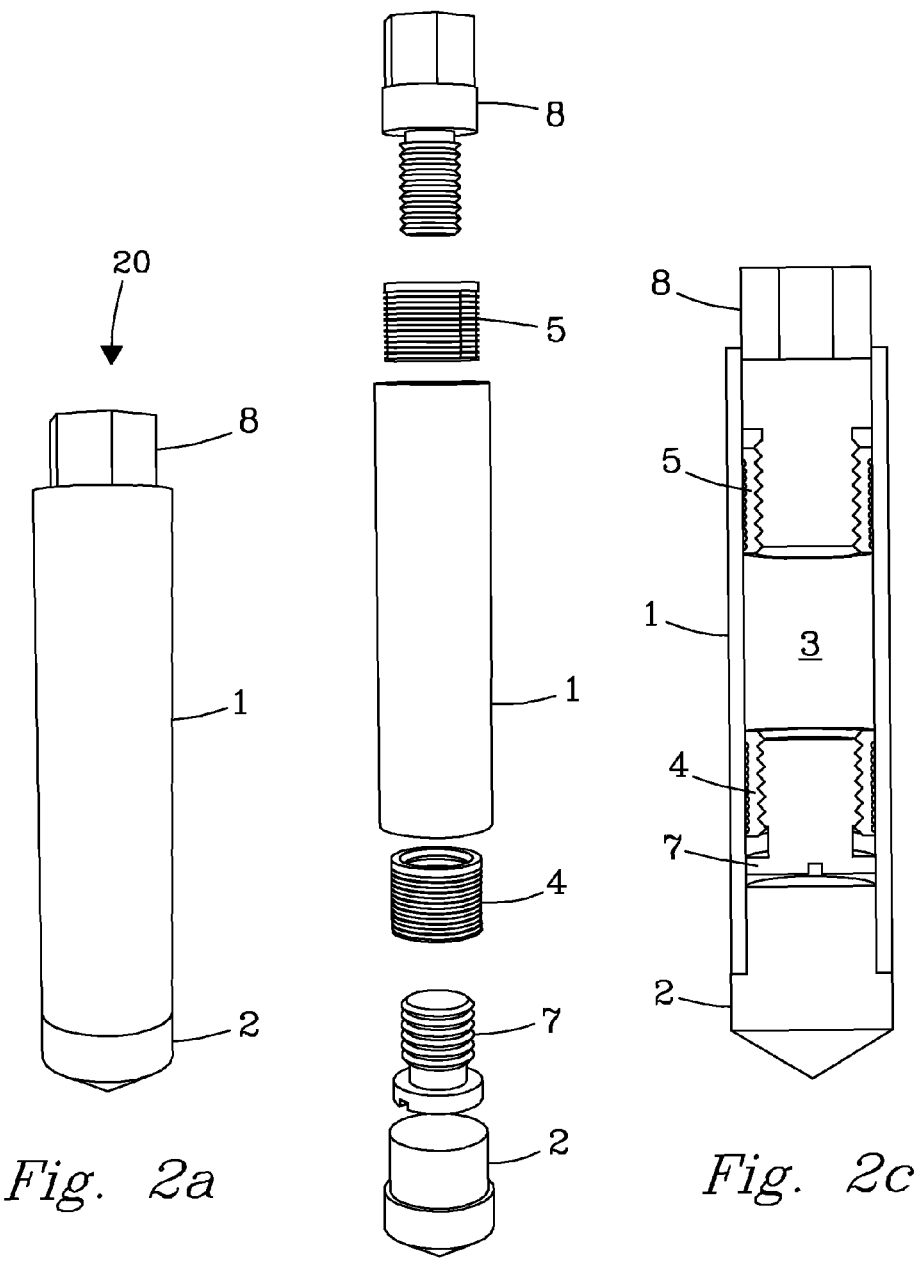

DEVICES AND PROCESS FOR HIGH-PRESSURE MAGIC ANGLE SPINNING NUCLEAR MAGNETIC RESONANCE

CROSS REFERENCE TO RELATED APPLICATION

This is a Divisional Application of U.S. patent application Ser. No.: 13/193,172 filed 28 Jul. 2011, now allowed, that claims priority from U.S. Provisional Application No.: 61/422,599 filed 13 Dec. 2010.

STATEMENT REGARDING RIGHTS TO INVENTION MADE UNDER FEDERALLY-SPONSORED RESEARCH AND DEVELOPMENT

This invention was made with government support under Contract DE-AC05-76RL01830, awarded by the U.S. Department of Energy. The government has certain rights in the invention.

FIELD OF THE INVENTION

The present invention relates generally to magic angle spinning (MAS) spectroscopy and magnetic resonance imaging. More particularly, the present invention relates to a high-pressure magic angle spinning rotor and process for high-pressure magic angle spinning nuclear magnetic resonance spectroscopy and imaging.

BACKGROUND OF THE INVENTION

Nuclear Magnetic Resonance (NMR) spectroscopy and imaging are powerful tools for obtaining detailed molecular structure and dynamics information for samples under investigation. NMR methods address numerous chemical, physical, and biological problems across various scientific disciplines. Magic Angle Spinning (MAS) is one of the most widespread NMR methods and is the only technique that allows a high resolution NMR spectrum to be acquired on solids, semi-solids, and mixtures of various sample materials. In MAS NMR, a sample is spun at a sample spinning rate of several kHz or more about an axis inclined at an angle of 54.74 degrees (°) with respect to the main magnetic field. Sample spinning speeds are used to average out line-broadening effects arising from common shielding interactions including, e.g., chemical shift anisotropic-gradients, dipolar-gradients, and magnetic-susceptibility gradients to give high-resolution NMR spectra. However, despite its wide spread application, MAS has not yet been reported in the literature at high-pressure conditions exceeding 70 bar due to various technical challenges that remain to be addressed. First, sample carriers cannot be made of metals due to strong eddy currents associated with a spinning metal in a strong magnetic field. This leaves non-metals for sample carriers including glasses, ceramics, and polymer plastics. Early development efforts in high-pressure MAS NMR investigated segmental motion of polymers (i.e., interchain distances within polymers) that were plasticized by dense gases. The sample carrier was a glass tube insert in which gas was cryogenically transferred into the carrier using a standard volumetric absorption method. The carrier was then flame-sealed or epoxy-sealed and subsequently inserted into a MAS rotor and balanced with KBr powder. The carrier was pressurized with xenon (Xe) and $CO_2$ gases. However, (i) reactions under a constant pressure were not obtained, (ii) maximum upper pressure was limited due to the use of thin glass tubes, and (iii) the carrier could not be re-opened to recharge and continue the sample reactions. A later carrier insert was made of DELRIN™ polymer that included an internal seal. The DELRIN™ insert included a cylindrical design that was inserted into a ceramic MAS rotor after pressurization. A 94.2 MHz $^{19}F$ MAS spectrum of $CH_3F$ gas was acquired using this carrier insert. However, significant penetration by the $CH_3F$ molecules into the DELRIN™ polymer material was observed over time, with a corresponding reduction in pressure. Similar penetration problems have been reported in the literature with $CO_2$ and $N_2O$ gases using MAS inserts made from the polymer PEEK®. In these experiments, pressure was limited because a fast sample spinning of several kHz or more was required. The sample rotor required a small diameter, which complicated the sealing necessary to attain high-pressures with this design. Polymer inserts made of polymers such as DELRIN™ and PEEK® are commonly plagued by strong unwanted carbon and/or proton background signals which can mask desired NMR signals in systems containing carbon, protons, or both. Thus, a high-pressure rotor is needed that provides sealing at high reaction temperatures and pressures, minimizes penetrations by sample molecules and fluids at high reaction temperatures and pressures, and minimizes background signals that complicate the desired signal, permitting high-resolution NMR spectra and images to be generated. The present invention meets these needs by addressing various problems known in the art. Additional advantages and novel features of the present invention will be set forth as follows and will be readily apparent from the descriptions and demonstrations set forth herein. Accordingly, the following descriptions of the present invention should be seen as illustrative of the invention and not as limiting in any way.

SUMMARY OF THE INVENTION

The present invention includes a high-pressure (HP) Magic Angle Spinning (MAS) rotor (HP-MAS-R) for generating high-resolution NMR spectra and images. The HP-MAS rotor of the invention includes a high-pressure rotor sleeve. The rotor sleeve is reusable, overcoming technical problems associated with prior art designs. In various embodiments, the sample rotor sleeve (cylinder) is composed of a ceramic. In some embodiments, the rotor sleeve is composed of a zirconia ceramic. In some embodiments, the rotor sleeve is composed of a silicon nitride (SiN) ceramic. The high-pressure rotor sleeve defines an integrated high-pressure sample cell. The sample cell spans the entire inner diameter of the rotor sleeve.

In some embodiments, the high-pressure rotor sleeve has an outer diameter dimension that ranges from about 4 mm to about 25 mm.

In some embodiments, the high-pressure rotor is a 9.5-mm MAS rotor that includes a high-pressure sample cell with a cell volume of at least about 350 uL.

In various embodiments, the sample cell includes various lengths providing variable sample volumes. The sample cell maintains a selected high pressure with the rotor when sealed.

In various embodiments, the rotor sleeve includes at least one grooved surface along the inner wall of the rotor sleeve positioned adjacent the sample cell. In some embodiments, a grooved surface is positioned above and below the sample cell along the length of the inner wall of the rotor sleeve. In some embodiments, the grooves are micro-grooves. In a preferred embodiment, at least one threaded sealing member is secured adjacent grooves along the inner wall of the rotor sleeve with a high-pressure adhesive. The adhesive is preferably applied such that it fills the gap between the grooves and the sealing member, yielding a high-pressure seal within the sample cell. In some embodiments, the sealing member is a threaded bushing composed of a high performance polymer plastic. Polymer plastics include, but are not limited to, e.g., polyether ether ketone polymer plastics, polyimide polymer plastics, polyamide-imide polymer plastics, including combinations of these various polymer plastics. In some embodiments, a sealing member is positioned above and below the sample cell, defining the upper and lower boundaries of the sample cell. In some embodiments, a high-pressure valve adapter and a sealing valve positioned above the sealing member provide sealing within the sample cell. In some embodiments, the valve adapter includes an introduction end that threads into a threaded bushing positioned at one end of the rotor sleeve. The valve adapter further includes a conical receiving surface that receives the introduction end of the sealing valve. In combination, these components seal the high pressure sample cell within the high pressure rotor sleeve. In preferred embodiments, the rotor sleeve defining the sample cell does not include a sample chamber insert or a sample cell insert. In some embodiments, the rotor sleeve includes a single opening at one end for introducing various sealing members including a threaded bushing that defines an upper or lower boundary of the sample cell. In some embodiments, the bushing is positioned adjacent grooves located along the inner wall at one end of the rotor sleeve. In some embodiments, a sealing valve introduced into the bushing seals the high pressure sample cell within the high pressure rotor sleeve.

In some embodiments, the rotor sleeve includes a single opening at one end that includes grooves for threading a sealing valve. The sealing valve when introduced defines an upper boundary of the sample cell and seals the sample cell within the high pressure rotor. In some embodiments, the sealing valve includes a driving tip head that allows rotation of the rotor from the driving tip head.

In some embodiments, the rotor sleeve includes a single opening at one end that includes a grooved surface along the inner wall for introducing a single sealing member therein. In some embodiments, the sealing member is a threaded bushing that is positioned adjacent the grooves within the rotor sleeve. The rotor further includes a sealing valve that when introduced into the bushing in the rotor sleeve defines an upper boundary of the sample cell that seals the sample cell within the rotor sleeve. In some embodiments, the sealing valve includes a driving tip head for rotating the rotor. In some embodiments, the high-pressure rotor includes a spinning tip composed of a homopolymer of chlorotrifluoroethylene.

In some embodiments, the sample cell includes a pressure greater than or equal to about 1 bar (1 bar=$10^5$ Pa=14.5 psi). In some embodiments, the sample cell includes a pressure between about 1 bar and about 70 bar. In some embodiments, the sample cell includes a pressure between about 40 bar and about 70 bar. In some embodiments, the sample cell includes a pressure greater than about 70 bar. In some embodiments, the sample cell includes a pressure greater than about 150 bar.

In some embodiments, the high-pressure MAS rotor allows a sample spinning rate greater than about 1 Hz. In some embodiments, the high-pressure MAS rotor allows a sample spinning rate between about 1 Hz and about 100 Hz. In some embodiments, the high-pressure MAS rotor allows a sample spinning rate between about 100 Hz and about 1 kHz. In some embodiments, the high-pressure MAS rotor allows a sample spinning rate between about 1 kHz and about 3.5 kHz. In some embodiments, the high-pressure MAS rotor allows a sample spinning rate up to about 3.5 kHz. In some embodiments, the high-pressure MAS rotor allows a sample spinning rate greater than about 3.5 kHz. In some embodiments, the high-pressure MAS rotor allows a sample spinning rate between about 3.5 kHz and about 5 kHz. In some embodiments, the high-pressure MAS rotor allows a sample spinning rate between about 5 kHz and about 18 kHz. In some embodiments, the high-pressure MAS rotor allows a sample spinning rate up to about 18 kHz.

In some embodiments, the high-pressure MAS NMR system includes an RF coil of a double saddle coil design that delivers a localized $B_1$ field. In one embodiment, the RF coil includes four (4) coil turns. In various embodiments, the number of coil turns is variable. In some embodiments, the RF coil includes RF shields positioned at respective ends of the RF coil that minimize background signals arising from sealing components positioned at respective ends of the high pressure rotor sleeve. In some embodiments, the RF coil of the high-pressure rotor employs a $^1H$ Lamor frequency greater than about 1 GHz. In some embodiments, the RF coil of the high-pressure sample rotor employs a $^1H$ Lamor frequency of from about 85 MHz to about 1 GHz. In some embodiments, the RF coil of the high-pressure sample rotor employs a $^1H$ Lamor frequency of from about 85 MHz to about 900 MHz. In some embodiments, the RF coil employs a magnetic field strength of at least about 2.0 Tesla. In various embodiments, the localized RF coil minimizes $^{13}C$ and $^1H$ background signals arising from the high-pressure rotor in the MAS NMR spectrometer.

The invention also includes a high-pressure rotor loading/reaction chamber (HP-RLRC). The HP-RLRC includes a holding member (seat) that holds the high-pressure rotor static while the high pressure sample cell within the rotor sleeve is filled with a sample at high pressure. The HP-RLRC also includes a rotation member that engages and rotates a sealing valve of the high-pressure sample cell, which seals or opens the high pressure sample cell in-situ while the high-pressure rotor remains statically positioned in the device. In some embodiments, the rotation member is a high-pressure thrust bearing. In some embodiments, HP-RLRC includes at least one fluid port for introducing one or more fluids independently into the sample cell within the high pressure rotor in-situ. The HP-RLRC permits the high-pressure valve of the high-pressure sample cell to be turned for sealing or opening the sample cell in-situ at high pressures and reaction temperatures. This configuration permits contents or reagents to be removed or added to the sample cell in-situ, allowing reactions within the HP sample cell to be sustained indefinitely under controlled high-pressure and temperature conditions in the HP-RLRC. In some embodiments, the loading/reaction chamber includes a thrust bearing that permits rotation of the high pressure sealing valve while the sample cell of the high pressure rotor is under fluid pressures between about 1 bar and 400 bar. The HP-RLRC is itself a high-pressure reaction device equipped with temperature measuring and controlling devices (e.g., thermocouples) and one or more viewing windows for viewing turning of the thrust bearing and engagement with the high pressure sealing valve therein. With these combined capabilities, a pressure exceeding 150 bar may be achieved with an absence of problems observed in prior art designs including, e.g., fluid penetration and loss of pressure. In some embodiments, in situ NMR is carried out by sealing the High Pressure MAS rotor (HP-MAS-R) under high pressure in the high-pressure rotor loading/reaction chamber (HP-RLRC) and then removing the HP MAS rotor for transfer and measurement in a NMR probe and repeatedly returning the MAS rotor (e.g., after NMR data are collected in the NMR spectrometer) to the HP-RLRC and replacing reactants or other constituents as needed. In situ NMR thus provides a snap-shot of reactions occurring at the same pressure and temperature conditions as those in the HP-RLRC. This capability has not been previously available in the art.

The present invention also includes a method for sealing a sample within the sample cell of the high-pressure (HP) MAS rotor. In various embodiments, the method includes introducing a quantity of a sample into the high-pressure sample cell within the high-pressure rotor sleeve, and sealing the sample within the high-pressure sample cell at a selected high pressure. The high-pressure sample cell spans the entire inner diameter of the rotor sleeve of the high-pressure rotor. In some embodiments, sealing the high-pressure sample cell includes sealing with a high-pressure sealing valve. In some embodiments, sealing includes turning the high-pressure sealing valve in concert with a high-pressure thrust bearing. In some embodiments, the sample cell is defined between a first and a second threaded bushing positioned within the rotor sleeve of the high-pressure MAS rotor. In some embodiments, a valve-adapter component is threaded into position atop the second bushing. In some embodiments, an end plug component is seated beneath the first bushing and a spin tip is positioned beneath the end plug component at the spinning end of the rotor sleeve. In some embodiments, a sealing valve is threaded into position atop the valve-adapter within the rotor sleeve. In some embodiments, the sample cell is sealed prior to pressurizing in the high-pressure rotor loading/reaction chamber (HP-RLRC). In some embodiments, the sample cell remains unsealed prior to pressurizing in the high-pressure rotor loading/reaction chamber (HP-RLRC).

In some embodiments, the fully assembled MAS rotor is mounted into a base block portion of the HP loading/reaction chamber device. A top block portion of the HP loading/reaction chamber device is mounted enclosing the HP MAS rotor within the HP loading/reaction chamber device. The mounting of the top block portion includes inserting a rotation shaft component through a center channel of the top block portion to align and engage it with the head of the valve component of the MAS rotor sleeve. A screw cap can then be mounted to seal the HP loading/reaction chamber device. Upon assembly, one or more high-pressure fluids can be introduced into the HP loading/reaction chamber device at a preselected pressure with a syringe pump assembly or other injection means to load the sample cell of the high-pressure rotor. If unsealed, the rotation shaft is turned to seal the high-pressure fluid inside the HP sample cell inside the HP MAS rotor sleeve. In various embodiments, the method further includes analyzing the sample present within the sample cell at the selected high pressure for a selected time by introducing the high-pressure rotor containing the sample into an NMR probe. In various embodiments, the method further includes opening the sealing valve of the high-pressure sample cell within the high-pressure rotor to recharge sample or fluid contents or reactants within the sample cell in-situ. In various embodiments, the method includes sealing the high-pressure sample cell at a high pressure greater than 1 bar.

The invention also includes a high-pressure spinning method. The method includes the step of spinning a sample at a magic angle within a high-pressure sample cell at a high pressure greater than 1 bar for a preselected time. In various embodiments, the high-pressure sample cell spans the inner diameter of a high-pressure rotor sleeve of a high-pressure rotor maintaining a selected high pressure therein when sealed. In some embodiments, the pressure within the high-pressure sample cell is between about 1 bar and about 70 bar. In some embodiments, the pressure within the high-pressure sample cell is greater than about 70 bar. In some embodiments, the pressure within the high-pressure sample cell is greater than about 150 bar.

In some embodiments, the high-pressure MAS rotor allows a sample spinning rate greater than about 1 Hz. In some embodiments, the high-pressure MAS rotor allows a sample spinning rate between about 1 Hz and about 100 Hz. In some embodiments, the high-pressure MAS rotor allows a sample spinning rate between about 100 Hz and about 1 kHz. In some embodiments, the high-pressure MAS rotor allows a sample spinning rate between about 1 kHz and about 3.5 kHz. In some embodiments, the high-pressure MAS rotor allows a sample spinning rate up to about 3.5 kHz. In some embodiments, the high-pressure MAS rotor allows a sample spinning rate greater than about 3.5 kHz. In some embodiments, the high-pressure MAS rotor allows a sample spinning rate between about 3.5 kHz and about 5 kHz. In some embodiments, the high-pressure MAS rotor allows a sample spinning rate between about 5 kHz and about 18 kHz. In some embodiments, the high-pressure MAS rotor allows a sample spinning rate up to about 18 kHz.

The purpose of the foregoing abstract is to enable the United States Patent and Trademark Office and the public generally, especially the scientists, engineers, and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

BRIEF DESCRIPTION OF THE DRAWINGS

FIGS. 2a-2c show different views of another embodiment of the invention.

DETAILED DESCRIPTION

A high-pressure magic angle spinning (MAS) NMR system and process are described that overcome various problems associated with conventional MAS instrument designs. The invention includes a high-pressure MAS rotor (HP-MAS-R) (FIGS. 1 and 2) that maintains high-pressures in a high-pressure sample cell in a MAS experiment. The sample cell maintains a high pressure with a minimum penetration loss over an extended period. The term "high pressure" means a pressure of at least 1 bar. The term "minimum penetration loss" means a pressure loss by penetration of less than about 20 percent (%) over a period of at least about 72 hours. The term "fluid" as used herein means a sample phase at conditions including, but not limited to, e.g., gas, liquid, near-critical, or supercritical conditions including combinations of these various phases. In some embodiments, the pressure within the high-pressure sample cell is between about 1 bar and about 70 bar. In some embodiments, the pressure within the high-pressure sample cell is greater than about 70 bar. In some embodiments, the pressure within the high-pressure sample cell is greater than about 150 bar.

The invention further includes a high-pressure loading and reaction chamber (HP-RLRC) (FIG. 3) capable of in-situ sealing and re-opening of the high-pressure sample cell within the high-pressure MAS rotor. The HP-RLRC provides sample access at selected high reaction pressures enabling continued reaction, analysis, or re-analysis described further herein.

The invention further includes a localized RF coil (FIG. 4) for use in a high-pressure MAS spectrometer that minimizes $^{13}$C and $^{1}$H background signals, yielding "clean" high-pressure NMR spectra suitable for high-pressure analyses and applications described further herein.

High-pressure MAS Rotor

Figures 1A, 1B:
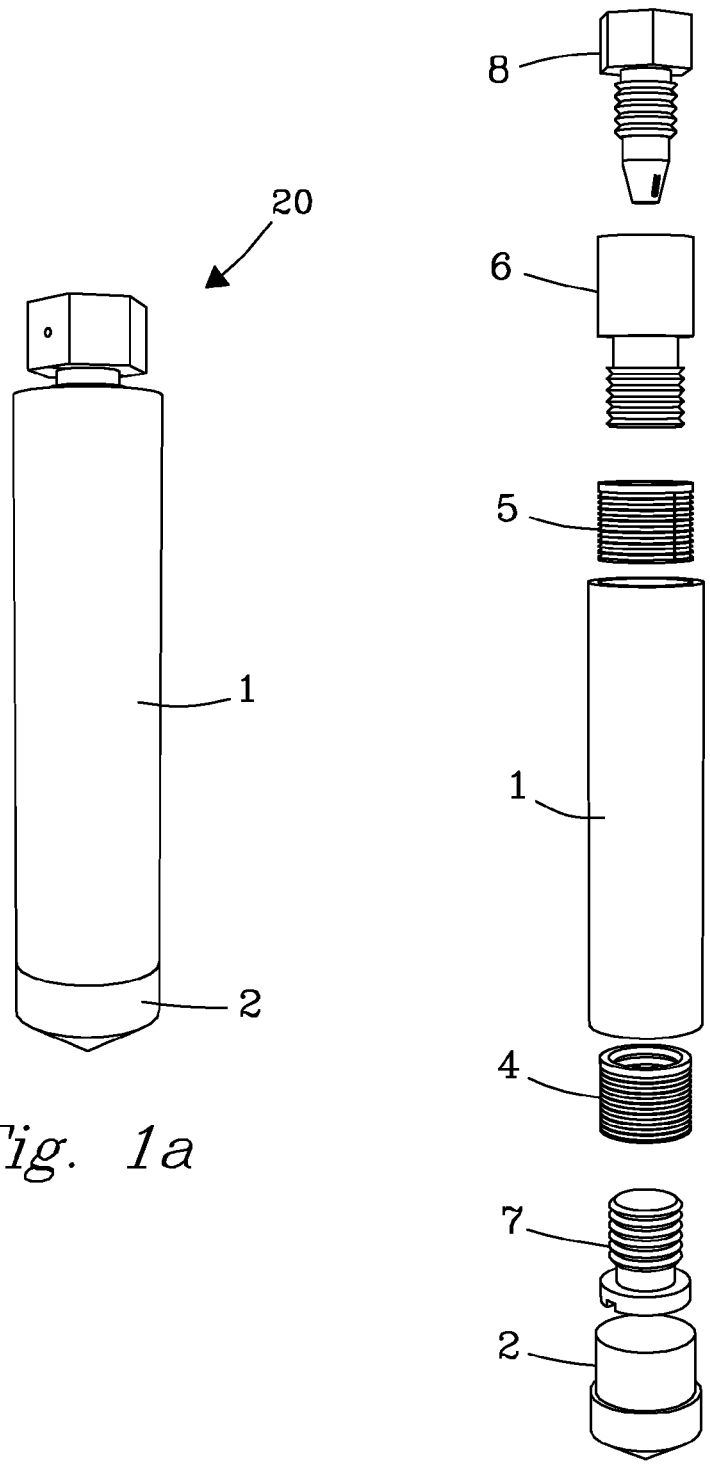
FIGS. 1a-1d show different views of one embodiment of the invention.
Figure 1C:
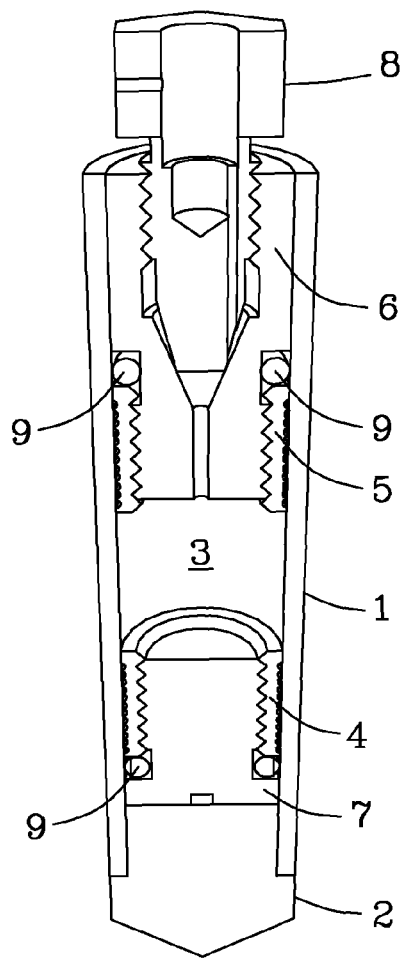

FIG. 1a shows a high-pressure MAS rotor 20, of a pencil-type design, according to one embodiment of the invention. The rotor has an outer diameter (O.D.) of 9.5 mm, but construction is not limited thereto. In the instant embodiment, rotor 20 includes an active sample volume of about 350 μL. Volumes are not limited. FIG. 1b is an exploded view showing the various components of high-pressure MAS rotor 20. In the figure, rotor 20 includes a rotor sleeve (cylinder) 1, a drive (spin) tip 2, bushings 4 and 5, a valve adapter 6, an end plug 7, and a high pressure sealing valve (end cap) 8. In a preferred embodiment, rotor sleeve 1 is composed of a ceramic including, e.g., zirconia ($ZrO_2$), zirconia variants comprising, e.g., $Al_2O_3$, MgO, CaO, and $Y_2O_3$, or another pressure durable material. In various embodiments, drive tip 2 is constructed of a machinable plastic (e.g., KEL-F®, 3M Company, St. Paul, Minn., USA) composed, e.g., of chlorotrifluoroethylene or another suitable plastic. In some embodiments, bushings 4 and 5 are of a cylindrical design constructed of a machinable plastic. Machinable plastics include, but are not limited to, e.g., polyether ether ketone polymers (e.g., PEEK®, Victrex USA, Inc., West Conshohocken, Pa., USA), polyimide-based polymers (e.g., VESPEL®, Dupont, Wilmington, Del., USA), polyamide-imide polymers (e.g., TORLON®, Solvay Advanced Polymers, L.L.C., Alpharetta, Ga., USA), or other suitable machinable plastics. In various embodiments, bushings 4 include threads on both the exterior and interior surfaces that allow the bushings to be positioned at various locations within rotor sleeve 1, e.g., in concert with other threaded (grooved) or assembly components. Location of sealing components (e.g., bushings, valves, valve adaptors, O-rings) is not intended to be limited. Sealing components can further include materials that increase the sealing strength for high pressure applications including, but not limited to, e.g., metal oxides, graphite, and polytetrafluoroethylene (PTFE), including combinations of these various materials. All sealing materials as will be implemented by those of ordinary skill in the art in view of this disclosure are within the scope of the invention. No limitations are intended. In some embodiments, valve adapter 6 has a threaded end portion that inserts into, and screws along, the interior receiving surface of bushing 5. High pressure sealing valve 8 includes a head portion, and a tapered end portion, that screws into the receiving end of valve adapter 6. In some embodiments, end plug 7 is positioned on an opposite side of rotor 1 and includes a threaded end that screws through the interior threaded surface below bushing 4. In the instant embodiment, drive tip 2 inserts into the bottom of rotor sleeve 1, providing rapid set-up for spinning a sample, and easy replacement of components of rotor 1 when needed. FIG. 1c is a cross-sectional view showing the fit of the various components of rotor 20, in assembled form. In some embodiments, grooves 14 are machined in rotor sleeve 1 at selected positions along the internal surface at respective ends. Grooves 14 are introduced, e.g., using a diamond mill that creates a rough surface. In the instant embodiment, grooves have a preferred depth of about 127 μm; distance between two adjacent grooves is about 793.75 μm, but groove depth and distance between grooves are not intended to be limited thereto. Bushings 4 and 5 insert into, and screw through along grooves 14 positioned along the milled surface of rotor sleeve 1. Bushings 4 and 5 are secured in place adjacent the threaded surface, e.g., at respective ends of MAS rotor sleeve 1, in concert with a high-pressure adhesive including, e.g., an Aremco-Bond™ epoxy adhesive (e.g., adhesive nos. 631, 526N, and 526NALOX2310) available commercially (e.g., Aremco Products, Inc., Valley Cottage, N.Y., USA), which is allowed to cure.

Figure 1D:
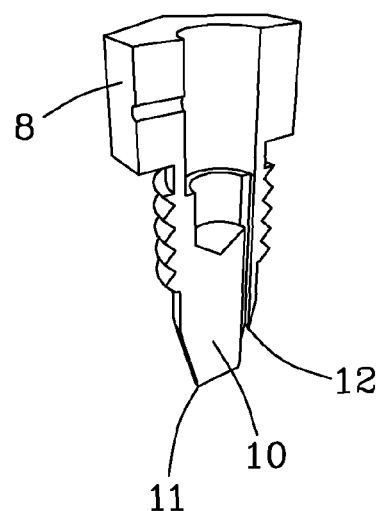

Bushings 4 and 5 form high-pressure seals within rotor sleeve 1 in concert with O-rings 9 positioned above and below bushings 4 and 5 in rotor sleeve 1. In a preferred embodiment, O-rings 9 are composed of fluoroelastomers (e.g., VITON®, Dupont Performance Elastomers, LLC, Wilmington, Del., USA), but polymers selected for use are not intended to be limited. For example, in other embodiments, O-rings 9 are composed of a nitrile-containing elastomer (e.g., BUNA-90®, WARCO BILTRITE, Orange, Calif., USA), or another suitable elastomer. In the instant embodiment, O-rings 9 have an exemplary dimension of 7×1.5 mm O.D.×cross-section (CS), but are not limited thereto. The threaded end of valve adapter 6 screws into the interior receiving surface of bushing 5. Bushings 4 and 5 define a sample cell 3. The present embodiment provides a sample cell volume of ~350 μL. Sample cell volumes are selectable. Thus, volumes are not limited. The present embodiment further eliminates plastic inserts within the volume of sample cell 3. Because plastic inserts are not employed within sample cell 3, background signals (e.g., $^{13}$C and $^{1}$H background signals) are significantly suppressed, which represents a distinct advantage over conventional MAS rotors known in the art. In this embodiment, end plug 7 and valve adapter 6 are not glued into rotor sleeve 1 in order to facilitate filling, re-filling, and cleaning of sample cell 3, and to effect rapid replacement of O-rings 9. In some embodiments, typical MAS rotor 20 achieves sample spinning speeds of up to about 3.5 kHz. But, spinning speed is not intended to be limited. Maximum spinning speed is limited only by failure of the rotor sleeve, which is a function of the centrifugal forces delivered to the rotor sleeve by both the sample spinning and the internal fluid pressure, as detailed further herein. MAS rotor 20 of the present invention achieves pressures exceeding those achieved with conventional rotors. In various embodiments, MAS rotor 20 achieves sample pressures between about 70 bar and 150 bar. In some embodiments, MAS rotor 20 achieves fluid pressures (e.g., $CO_2$) of at least about 100 bar. In yet other embodiments, MAS rotor 20 achieves pressures exceeding 150 bar with minimal penetration pressure losses over an extended period, as described further herein. No pressure limitations are intended. FIG. 1d shows a close-up view of high pressure sealing valve (end cap) 8. In the instant embodiment, sealing valve 8 is of a high-pressure fitting design that includes a conical (V-shaped) receiving end 10. Receiving end 10 exerts pressure on O-ring 9 through adapter 6 positioned immediately adjacent the V-shaped end 10. Sealing in rotor sleeve 1 is achieved between sealing valve 8 and valve-adaptor 6 when the tapered end of sealing valve 8 is threaded tightly into the conical shaped receiving end 10 of valve-adaptor 6. Sealing within the rotor sleeve 1 is achieved by turning sealing valve 8 less than half a turn. Consequently, pressure inside cell 3 after sealing is essentially the same as the outside pressure. Sealing valve 8 further includes an off-center needle channel 12 located just off (~1524 μm) the symmetric axis of valve 8 that links to sample cell 3 when sealing valve 8 is loosened, allowing high-pressure fluids to be introduced into sample cell 3 prior to, or during an experiment; or, to release fluids from sample cell 3 at any time during or after an experiment. Position and dimensions of needle channel 12 are not limited. Volume change of fluids inside sample cell 3 before and after sealing is minimized, which is important for accurately setting up experimental conditions before the sample is moved to an NMR spectrometer or probe (not shown) for analysis.

Centrifugal Force

The centrifugal force of a point mass, $F_c$, due to spinning is given by Equation [1], as follows:

$$Fc = m*\omega^2 r = 4\pi^2 *m*f^2 *r \quad [1]$$

Here m is the mass (Kg); f is the rotating frequency (Hz); and r is the distance (meters) between the rotating mass and the center of rotation. Pressure $P_c$ is then given by:

$$P = \frac{Fc}{A} \quad [2]$$

Here A is the surface area. The centrifugal force $F_c$ is converted to an equivalent pressure value $P_c$, as given by Equation [3]:

$$P_C = \frac{\frac{\Delta\theta(R_2 + R_1)}{2}*(R_2 - R_1)*L*\rho*\omega^2*R_2}{\Delta\theta*R_1*L} \quad [3]$$

-continued
$$= \frac{(R_2 + R_1)*(R_2 - R_1)*\rho*\omega^2*R_2}{2*R_1}$$

Here $R_1$ is the internal radius of the rotor sleeve; $R_2$ is the outer radius of the rotor sleeve; ρ is the density of the rotor sleeve (for zirconia, ρ=6.52 g/cm³); L is the length of the rotor sleeve (cylinder), and ω is the angle (in radians) of the very small arc spanned by the very small mass. The equivalent pressure due to the centrifugal force is given by Equation [4] as follows:

$$P_C = \frac{(R_2 + R_1)*(R_2 - R_1)*\rho*\omega^2*R_2}{2*R_1} \quad [4]$$

$$= 0.025405 \frac{g}{mm}*4\pi^2 f^2$$

$$= 1.002952 \frac{g}{mm} f^2 = 1.002952 \frac{kg}{m} f^2$$

$$= \frac{1.002952}{100000} f^2 \text{ bar}$$

Here f is the sample spinning rate (units of Hz). At sample spinning rates of 2 kHz, 3.5 kHz, and 7 kHz, e.g., equivalent pressures due to spinning are 39.7 bar, 121.6 bar, and 486.6 bar, respectively. Rotor sleeve (cylinder) 1 is configured for high-pressure MAS applications. In the exemplary embodiment, rotor sleeve 1 of rotor 20 is composed of zirconia with dimensions that include an O.D. of 9.5 mm and an I.D. of 8 mm. Rotor sleeve 1 can withstand a combined pressure from fluids and centrifugal spinning forces up to 482 bar (7000 psi). For example, at a sample spinning rate of 3.5 kHz (representing a centrifugal spinning force of 121.6 bar), zirconia rotor sleeve 1 of the exemplary embodiment can withstand a fluid pressure of about 360 bar (5400 psi) (i.e., 482 bar minus 121.6 bar). Therefore, at operating pressures up to 150 bar and above, rotor sleeve 1 is not a limiting factor for achieving a maximum fluid pressure in sample cell 3.

FIGS. 2a-2c show another embodiment of high-pressure MAS rotor 20, of a 6.0 mm outer diameter (O.D.) design. In this embodiment, sealing valve 8 inserts directly into bushing 5. In this embodiment, no valve adapter (FIG. 1b) is employed within rotor sleeve 1 due to the narrow interior diameter. All other assembly components are as previously described for FIGS. 1a-1d.

Figure 3A:
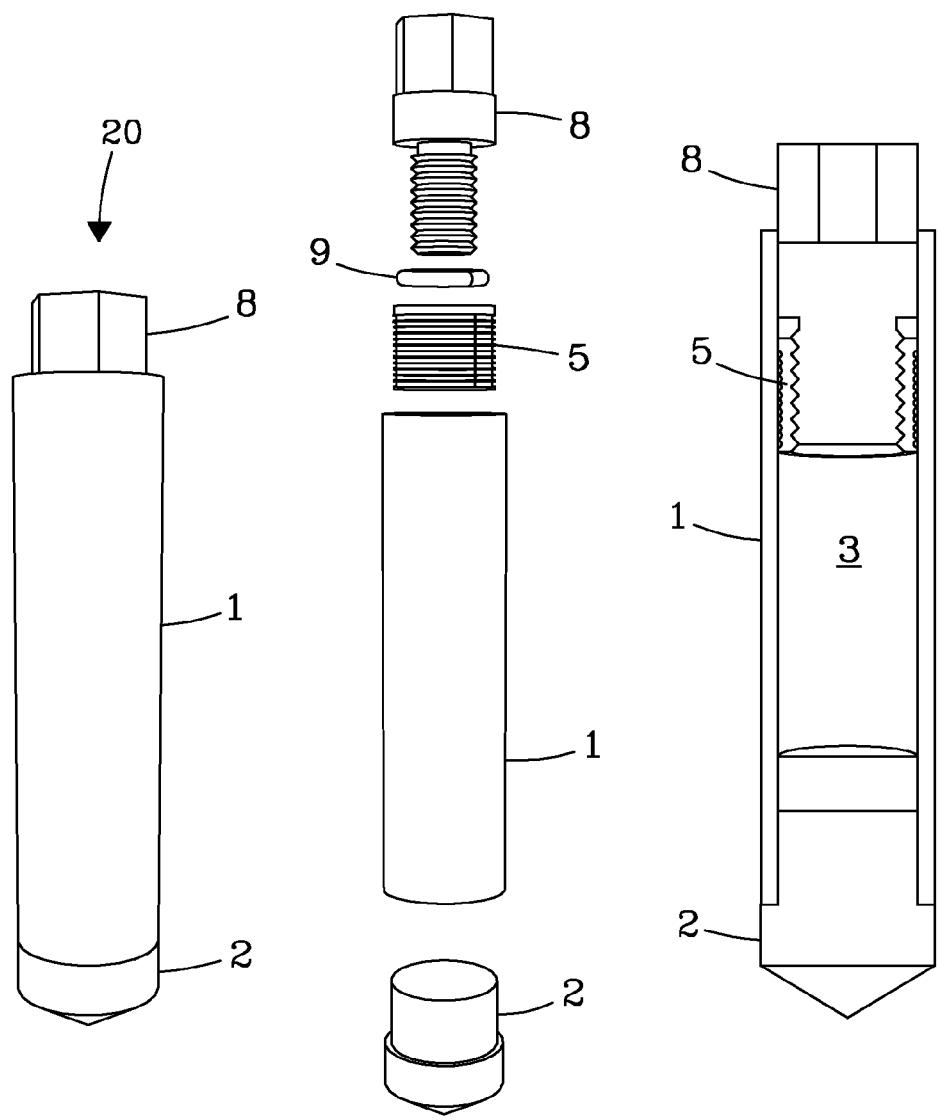
FIGS. 3a-3d show different views of yet other embodiments of the invention.
Figure 3B:
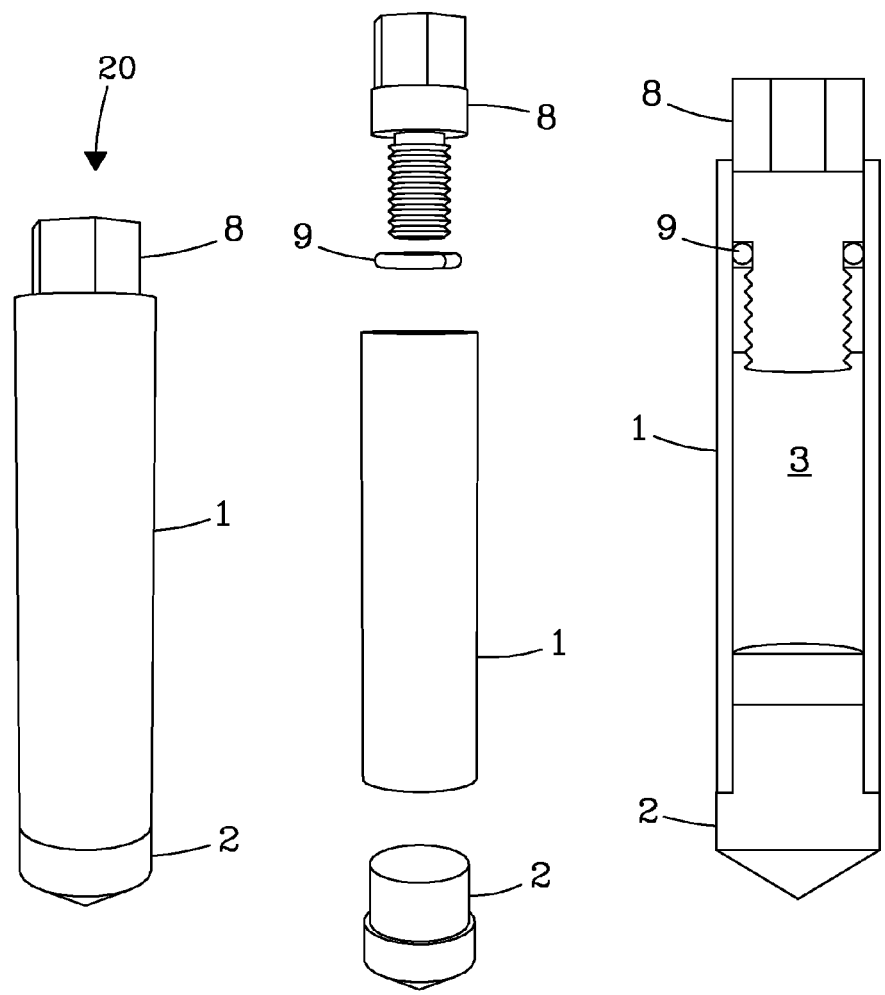
Figure 3C:
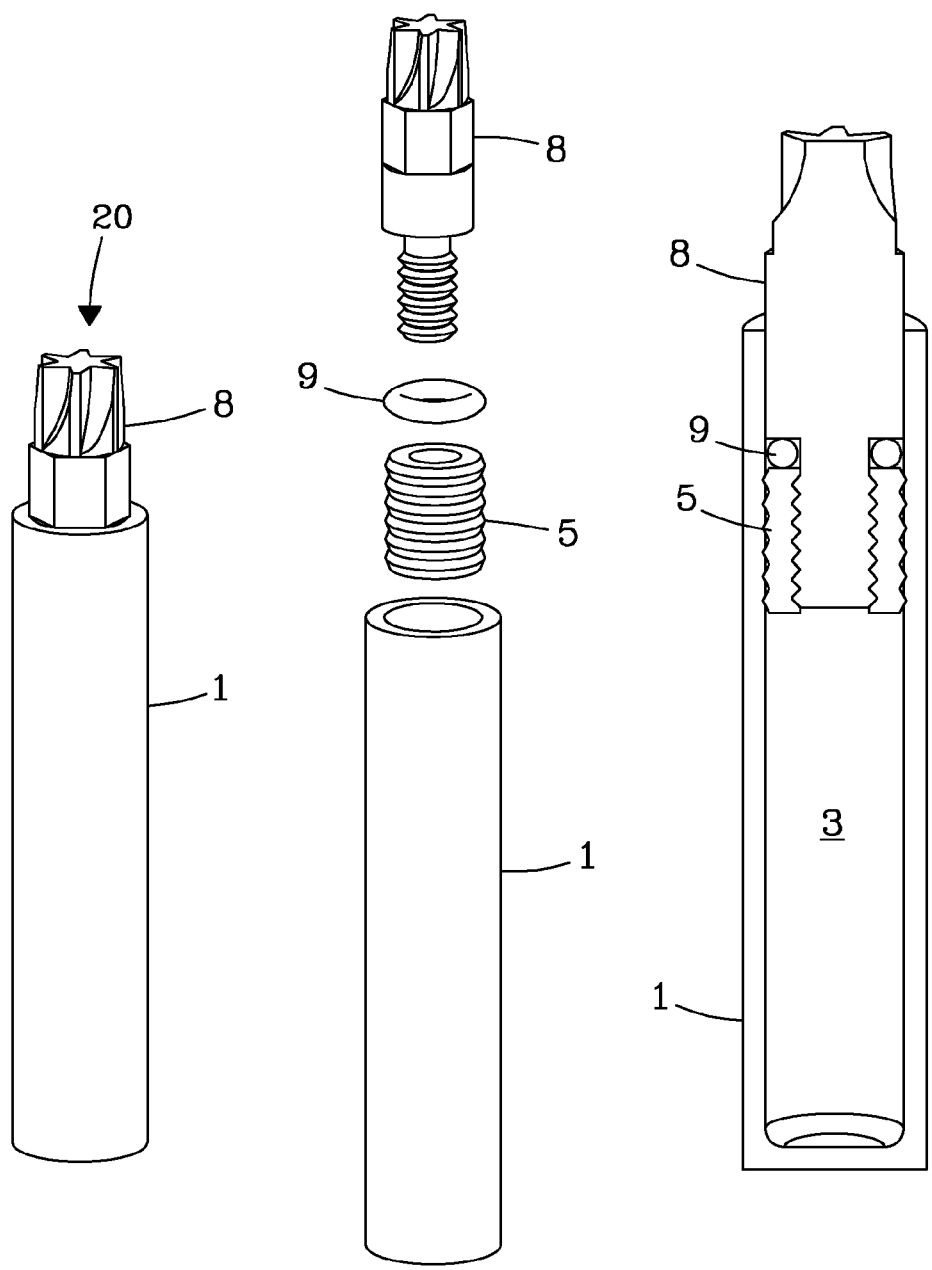
Figure 3D:
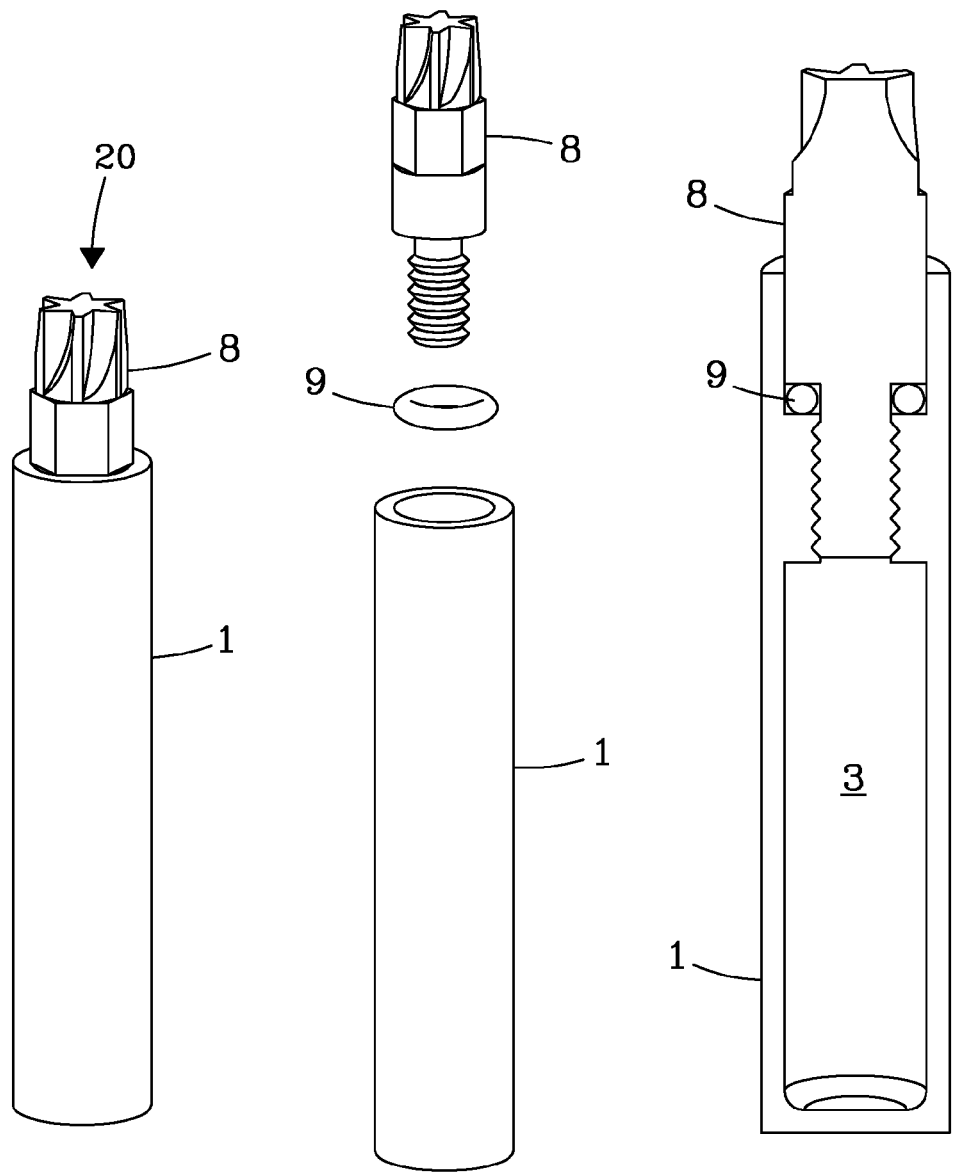

FIGS. 3a-3d show various alternate designs for the high-pressure MAS rotor 20, according to different embodiments of the invention. In FIG. 3a, rotor 20 includes a rotor sleeve 1 that has one open end. In this embodiment, a threaded bushing 5 is introduced through the upper end of sleeve 1 and glued to sleeve 1 adjacent grooves machined into the wall along sleeve 1, as described herein for FIG. 1. Sample cell 3 includes one closed end. Upper boundary of sample cell 3 is defined by position of bushing 5 along sleeve 1. Sample cell 3 is sealed in concert with an O-ring 9 positioned atop bushing 5 and introduction of sealing valve 8. Drive tip 2 is a separate component that is inserted at the bottom of rotor sleeve 1. In FIG. 3b, rotor 20 includes a rotor sleeve 1 with one open end. In this embodiment, sleeve 1 includes threads machined into the wall at the upper end of sleeve 1 into which sealing valve 8 is introduced. Sample cell 3 includes one closed end. Sample cell 3 is sealed by introducing sealing valve 8 through an O-ring 9 and screwing sealing valve 8 into threads along the wall at the upper end of sleeve 1. Drive tip 2 is a separate component that is inserted at the bottom of rotor sleeve 1. In FIG. 3c, rotor 20 includes a rotor sleeve 1 that has one open end. A threaded bushing 5 is introduced through the upper end of sleeve 1 and glued to sleeve 1 adjacent grooves machined into the wall along sleeve 1, as described herein for FIG. 1. Upper boundary of sample cell 3 is defined by position of bushing 5 along sleeve 1. Sample cell 3 is sealed by introducing valve 8 through an O-ring 9 and turning sealing valve 8 into threads positioned along the interior wall of bushing 5. In this embodiment, sealing valve 8 is of a combination drive tip/valve design in which the valve and drive tip are one body. This design permits rotation of rotor 20 from the top end of rotor 20. In this embodiment, a separate drive tip (FIG. 3b) is not required. In FIG. 3d, rotor 20 includes a rotor sleeve 1 with one open end. In this embodiment, sleeve 1 includes threads machined into the wall at the upper end of sleeve 1 into which valve 8 is introduced. Sample cell 3 is sealed by inserting sealing valve 8 through an O-ring 9 and turning sealing valve 8 into threads positioned along the inner wall at the upper end of sleeve 1. In this embodiment, sealing valve 8 is a combination valve and drive tip, which permits rotation of rotor 20 from one end (e.g., the top end) of rotor 20. Thus, a separate drive tip (FIG. 3b) is not required. A high-pressure rotor loading/reactor chamber will now be described.

High-pressure MAS Rotor Loading Chamber/Reactor

FIGS. 4a-4e show different views of a high-pressure rotor loading/reaction chamber (HP-RLRC) 50, according to one embodiment of the invention. Loading chamber 50 is a high-pressure and high-temperature reaction device configured for both in situ sealing and in situ opening of the sealing valve (FIG. 1 and FIG. 2) of the high-pressure MAS rotor (HP-MAS-R). Loading chamber 50 includes a main (top) block portion 30 and a lower (bottom) block portion 32. Main (top) block portion 30 and lower (bottom) block portion 32 of high-pressure loading chamber 50, are constructed preferably of stainless steel. In the instant embodiment, main (top) block portion 30 and lower (bottom) block portion 32 are held together by eight bolts (e.g., 7.8 mm diameter and 120 mm long), but construction is not limited thereto. In the present embodiment, two O-rings 24 (e.g., two) composed of a high-performance elastomer are used to achieve a high-pressure seal between top block 30 and bottom block 32. High-performance elastomers include, but are not limited to, e.g., nitrile-containing elastomers (e.g., BUNA-90®, WARCO BILTRITE, Orange, Calif., USA), fluoroelastomers (e.g., VITON®, Dupont Performance Elastomers, LLC, Wilmington, Del., USA) or other durable elastomers. In the present embodiment, the two O-rings have typical dimensions of: 65 mm×2.5 mm OD×CS (cross-section of the O-ring diameter) and 50×2.5 mm OD×CS, respectively. Number of O-rings is not limited. Top block portion 30 includes a rotation mechanism 25 (including a rotation shaft 22) and one or more viewing windows 36 that facilitate engagement between rotating mechanism 25 and sealing valve 8 during sealing or reopening of the high-pressure MAS rotor 20. Windows 36 are preferably made of a transparent material. Example window materials include, but are not limited to, e.g., polycarbonate, quartz, and sapphire. In the instant embodiment, each window 36 is held in place, e.g., with a stainless steel plate 37 and eight bolts, or another suitable construction. Loading chamber 50 further includes a lower (bottom) portion 32 that includes rotor seat 48 for holding the high-pressure MAS rotor 20 while the sample cell (FIG. 1 and FIG. 2) is loaded with sample. In the present embodiment, a thermocouple (not shown) is inserted into a channel 45 positioned near or adjacent rotor seat 48 to measure temperature at the level of the high-pressure MAS rotor 20.

Loading chamber 50 allows for loading and sealing of high-pressure fluids inside the high-pressure MAS rotor 20. In addition, loading chamber 50 allows for repeated opening and sealing of valve 8 of the high-pressure MAS rotor 20 in-situ. Reactions can thus be carried out indefinitely under controlled high-pressure and temperature conditions by returning the high-pressure MAS rotor 20 to the high-pressure rotor loading/reaction chamber 50, permitting introduction and re-introduction of high-pressure fluids, or an additional reagent or reactant into sample cell 3 of rotor 20. Operation of the rotation seal mechanism 25 while loading the sample cell (FIGS. 1 and 2) is described hereafter.

Figure 4A:
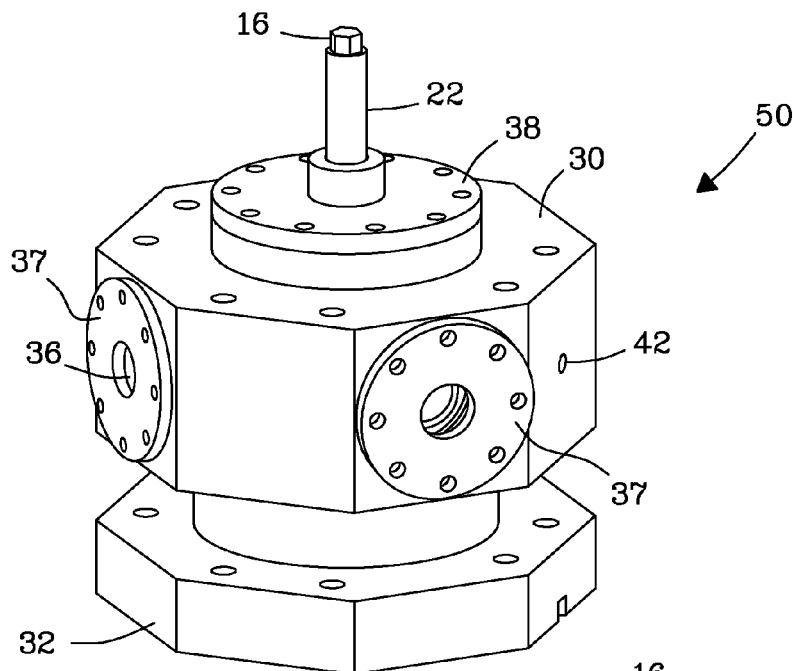
FIGS. 4a-4e show different views of a high-pressure loading/reaction chamber, according to another embodiment of the invention.
Figure 4B:
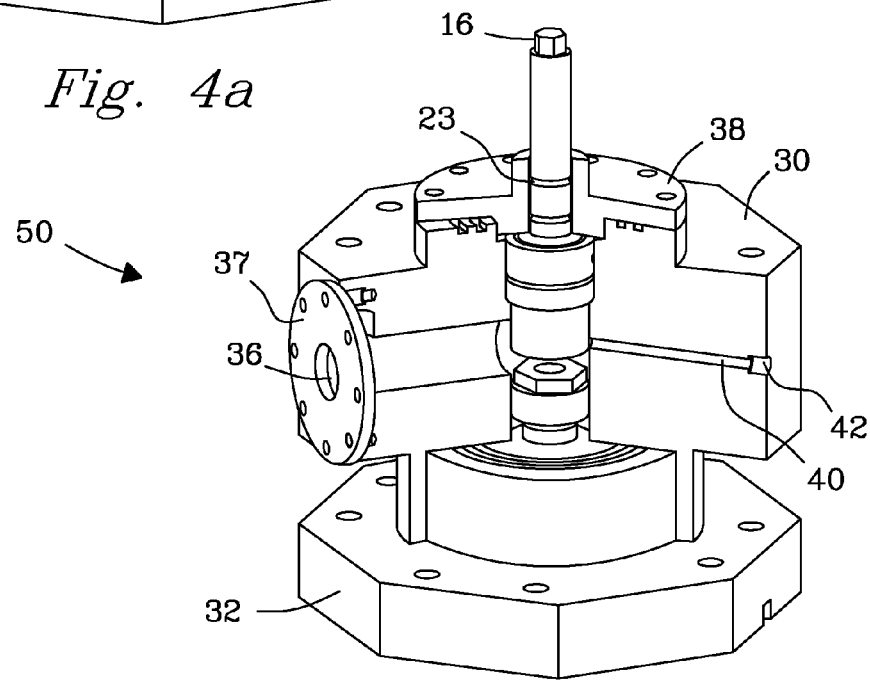

FIG. 4b shows a cut-away view of top block portion 30. In the figure, rotating (rotation) shaft 22 includes two O-rings 23, positioned, e.g., to properly align, secure, and seal rotating shaft 22 within chamber 50. View windows 36 are positioned in top block portion 30 to view, and facilitate engagement of, rotation mechanism 25 with sealing valve 8 of the high-pressure rotor 20 during operation. Upper block 30 further includes one or more gas input ports 40 with control valves 42 that allow several different gases to be introduced to chamber 50.

Figure 4C:
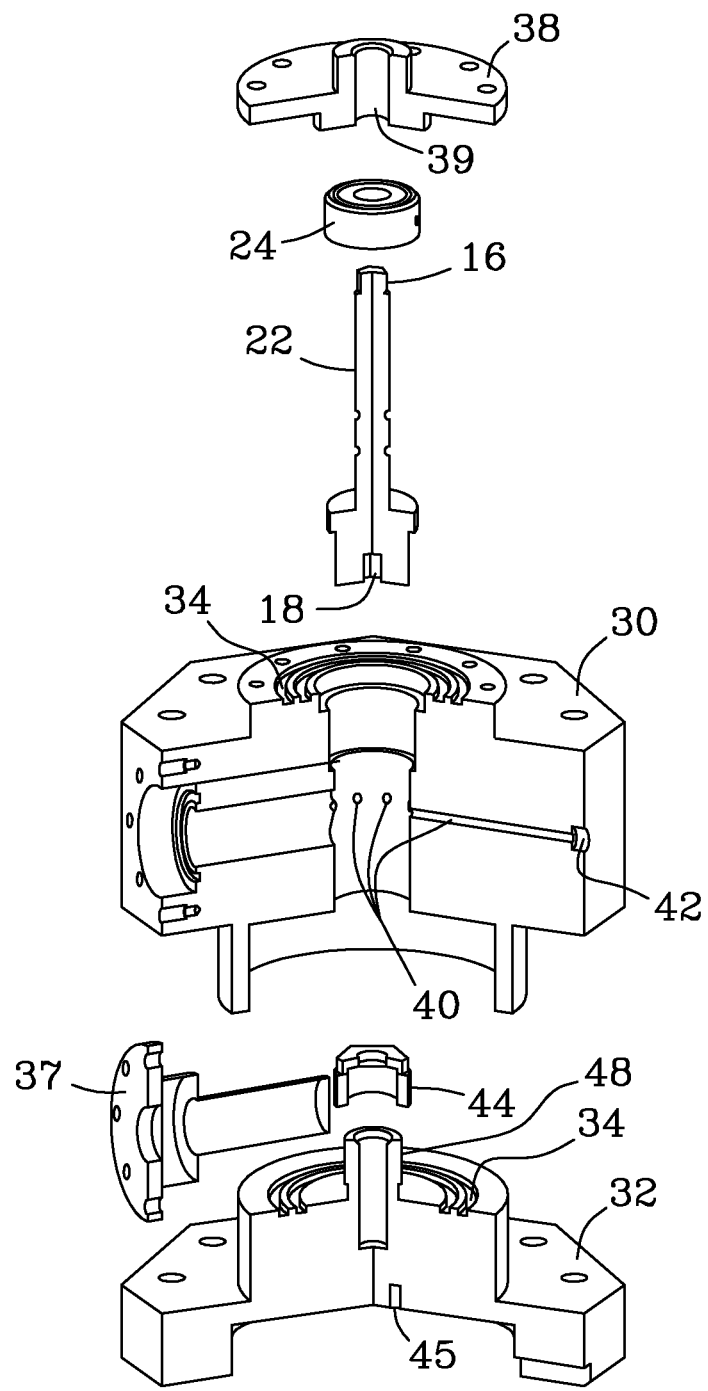

FIG. 4c shows an exploded view of rotation mechanism 25 (in top portion 30 of chamber 50) for sealing and opening of high-pressure MAS rotor 20 in situ, and holding mechanism 26 (in bottom portion 32 of chamber 50) for mounting and tightly holding rotor 20 within chamber 50. In the instant embodiment, when components are mounted in place, including the high-pressure MAS rotor 20, the net volume for the high-pressure fluids in the reaction chamber is about 9 cm$^3$. Upper block 30 includes one or more input ports 40 with control valves 42 that allow several different fluids to be introduced to chamber 50. Pressure gauges (not shown) may also be coupled to at least one fluid input port 40 to accurately read pressures inside the high-pressure loading chamber 50. Thermocouples (not shown) may be inserted through one or more fluid inlet ports 40 to accurately measure temperature inside the high-pressure loading chamber 50. Construction is not intended to be limited. All construction designs as will be implemented by those of ordinary skill in the art in view of the disclosure are within the scope of the invention.

Figure 4D:
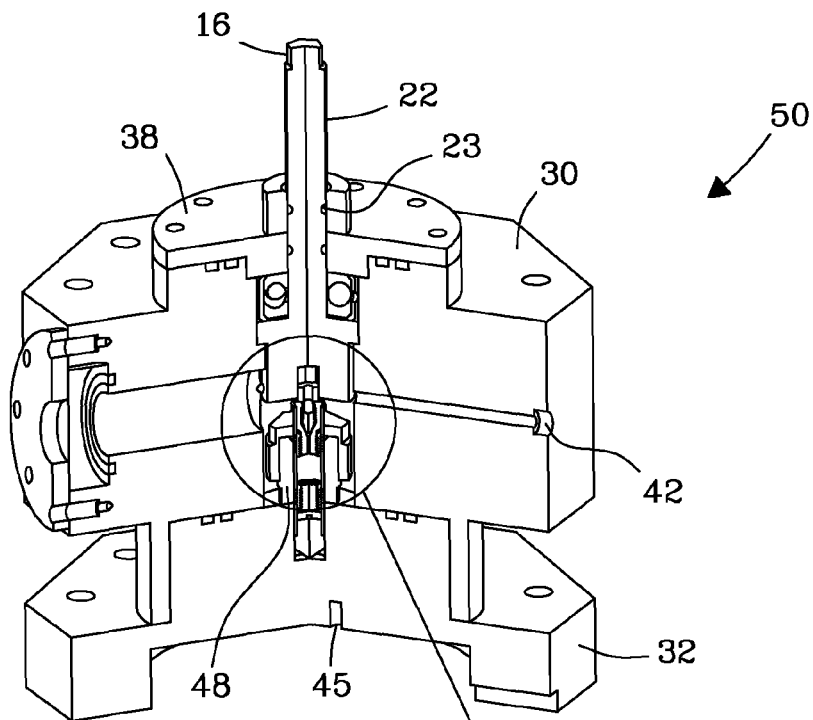

FIG. 4d shows a cross-sectional view of rotation mechanism 25 and holding mechanism 26 inside high-pressure MAS rotor 20. Rotation seal mechanism 25 includes a rotating (rotation) shaft 22 and a stainless steel high-pressure thrust bearing 24. Thrust bearing 24 facilitates rotation of sealing valve 8 of rotor 20 under high-pressure. Rotating shaft 22 includes a hexagonal shaped groove 18 positioned at one end that engages the hexagonal head 16 of sealing valve 8, allowing for tightening and loosening of sealing valve 8. Cap plate 38 is secured atop top block portion 30 using, e.g., ten stainless screws, but construction is not limited thereto. Two O-rings 34 (e.g., a 60×2.5 mm O.D.×CS and a 40×2.5 mm OD×CS) positioned in grooves below cap plate 38 atop top block portion 30 are used in combination with cap plate 38 to seal rotation mechanism 25 within chamber 50 at high-pressure. Cap plate 38 also defines a center opening 39 through which one end of rotation shaft 22 extends after coupling to rotor 20. In bottom block portion 32, screw cap 44 defines a center opening 45 for insertion of rotor 20 within chamber 50. Screw cap 44 includes an O-ring 46 positioned to secure high-pressure rotor 20 in place. Screw cap 44, when attached, squeezes O-ring 46 tightly against the surface of rotor 20, securing and aligning high-pressure rotor 20 in place within chamber 50. In operation, friction is adequate to hold rotor 20 in place during rotation of shaft 22.

Figure 4E:
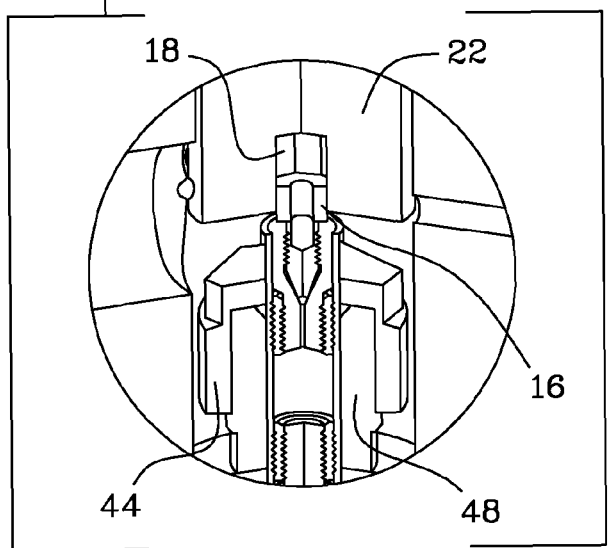

FIG. 4e presents an enlarged view of high-pressure rotor 20 showing the engagement between groove 18 of rotation shaft 22 and hexagonal head 16 of sealing valve 8. As shown in the figure, rotation shaft 22 only undergoes rotational motion with no net vertical movement downward. Thus, in operation, only sealing valve 8 is driven vertically downward while engaged with hexagonal groove 18 of rotation shaft 22 thereby creating the required seal. High-pressure chamber 50 is connected to a primary programmable high-pressure syringe pump (e.g., a 100 cc ISCO-D Series syringe pump, Teledyne Isco, Inc., Lincoln, Nebr., USA) rated to a pressure of, e.g., 500 bar, and a secondary piston screw pump (not shown) (e.g., a 10 cc, manually-operated piston screw pump, High-pressure Equipment Company, Erie, Pa., USA) that can boost pressure up to 4000 bar. A high-pressure bench (not shown) controls mixtures of fluids introduced into high-pressure loading chamber 50 at selected pressure and temperatures. Temperature of HP-RLRC 50 is controlled in concert with a heating device (e.g., a 400° C. Cimarec® hotplate, ThermoFisher Scientific, Waltham, Mass., USA) that provides homogeneous heating of HP-RLRC 50.

Sample Loading

The following steps describe loading and sealing of samples and high-pressure gases in sample cell 3 of the 9.5 mm HP-MAS-R rotor 20 design of FIG. 1. {START}. In a first step {202}, sample cell 3 is cleaned without end plug 7, valve-adaptor 6 and sealing valve 8 components in place. Next {204}, sample is loaded into sample cell 3. Next {206}, after loading the sample, the inner thread of bushing 5 is optionally cleaned of sample, and the valve-adaptor 6, including any O-rings 9, are mounted in place. Next {208}, sealing valve 8 is carefully mounted and turned into place. In some embodiments of the process, sealing valve 8 is immediately sealed upon mounting in cases where short exposure times with a selected fluid are desired. In other embodiments of the process, sealing valve 8 is mounted and turned into place, but not sealed. In another step {210}, the assembled rotor 20 with its assembled components is seated in rotor seat 48 in bottom block portion 32 of the HP-RLRC 50 (see FIG. 2d). Rotation shaft 22 aligns with, and engages, sealing valve 8 in high-pressure MAS rotor 20. In another step {210}, a desired fluid (or fluids) is introduced into sample cell 3 of the high-pressure rotor 20 at a selected fluid pressure through one or more fluid ports 40 of high-pressure loading chamber 50 with the syringe pump assembly described previously herein. If sealing valve 8 is not sealed during pressurization of HP-RLRC 50, then pressure inside and outside HP-MAS-R 20 is equal. If HP-RLRC 50 is pressurized with valve 8 sealed, needle channel 12 inside sealing valve 8 of the high-pressure MAS rotor 20 allows pressure outside and inside sample cell 3 to rapidly equalize when valve 8 is opened and fluid enters sample cell 3 of HP-MAS-R 20. After equilibrium pressure is attained, clockwise rotation of rotation shaft 22 seals the one or more high-pressure fluids inside MAS rotor 20. Likewise, a counter-clockwise rotation opens sealing valve 8 and exposes sample cell 3 through the needle hole 12 in the sealing valve 8 to fluids present in high-pressure chamber 50. Opening and closing of sealing valve 8 when rotor 20 is mounted inside chamber 50 is preferably performed when pressure inside and outside the MAS rotor 20 are about the same to minimize the amount of external force or torque needed to perform the operation, but is not limited thereto. {END}. As will be understood by those of ordinary skill in the art, method steps can be tailored for loading samples into the sample cell of other embodiments of the invention. Thus, no limitations are intended.

Transferring High-Pressure Rotor

The pressurized HP-MAS-R 20 containing a preselected sample is transferred within a (e.g., a screw-capped) safety canister (not shown). In the instant embodiment, the safety canister is of a cylindrical shape design preferably composed of stainless steel which is preheated for a selected time (e.g., a few hours) at a selected temperature (i.e., the same temperature as in HP-RLRC 50) to maintain the rotor 20 at desired temperatures. Exemplary dimensions include 8 mm thick walls, a 16 mm thick bottom, and a top sealing cap. In-situ NMR is subsequently carried out by sealing high-pressure MAS rotor (HP-MAS-R) 20 in high-pressure loading/reaction chamber (HP-RLRC) 50 in-situ and then moving the HP-MAS rotor 20 with charged sample to the NMR spectrometer (not shown) for measurements and analyses. In-situ NMR is thus representative of reactions occurring at the same pressure and temperature conditions within HP-RLRC 50.

RF Coil with B1 Localization

Figure 5A:
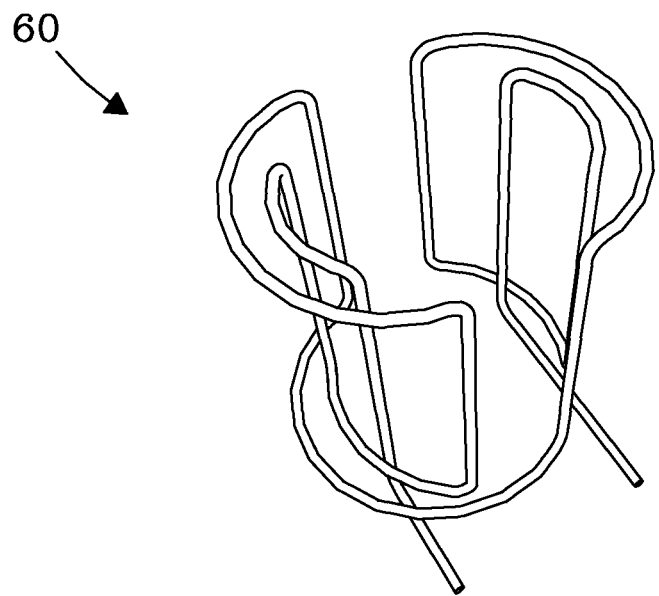
FIGS. 5a-5b show an RF Coil of a Saddle Coil design that provides localized $B_1$ fields, according to different embodiments of the invention.
Figure 5B:
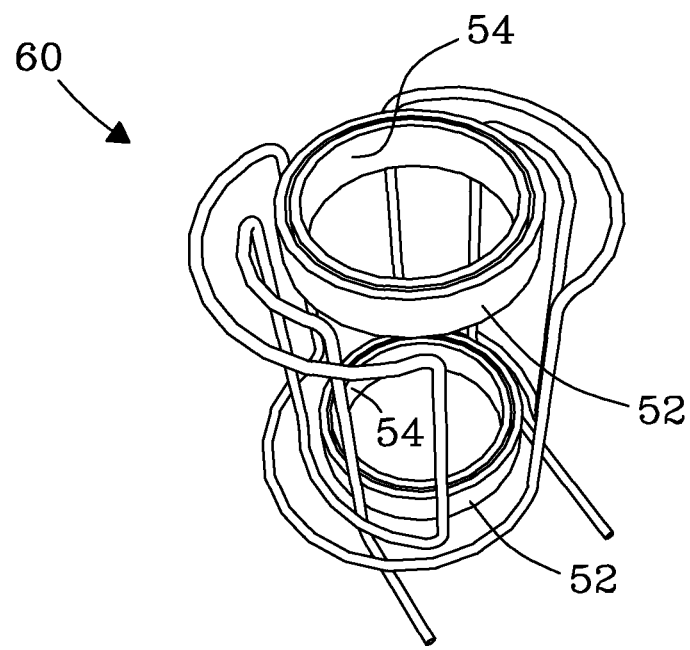

FIG. 5a shows an RF coil 60 of a saddle-coil design employed in concert with the invention, according to an embodiment of the invention. The RF coil 60 of the present embodiment includes 4 coil turns inclined at a magic angle of 54.74° with respect to the magnetic (bore) Z-axis. In some embodiments, a magnetic field of 7.05 T is employed that corresponds to a $^1H$ Larmor frequency of 300 MHz. RF coil 60 delivers a localized $B_1$ field that minimizes background NMR signals ($^{13}C$ and $^1H$ background signals) stemming from plastic sealing components located at respective ends of the high-pressure MAS rotor. In one embodiment, a $^{13}C$ 90 degree pulse is obtained using a 5.5 µs pulse width at an input power of 504 Watts. Pulse and power selections are not intended to be limited. FIG. 5b shows an RF Coil 60 according to another embodiment of the invention. In the figure, RF Coil 60 includes two insulator panels 52 for discharging charge and two RF shields 54 composed of thin cylindrical copper plates positioned at respective ends of RF coil 60 that improve $B_1$ localization in the sample cell (FIG. 1 and FIG. 2) of the high-pressure rotor. In some embodiments, RF shields 54 can be used to minimize background signals in the NMR spectra arising from plastic sealing components employed within HP-MAS-R 20.

Background Signal Data

Figure 6A:
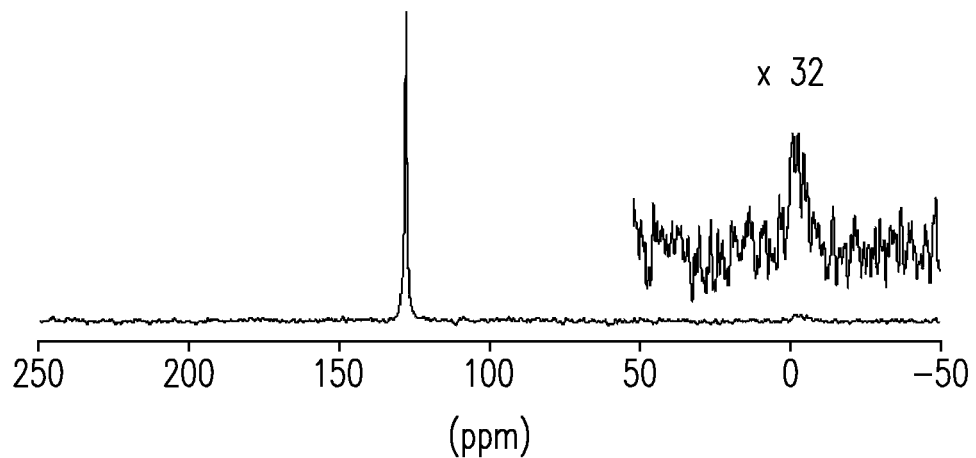
FIGS. 6a-6b show background signal data for an embodiment of the invention.
Figure 6B:
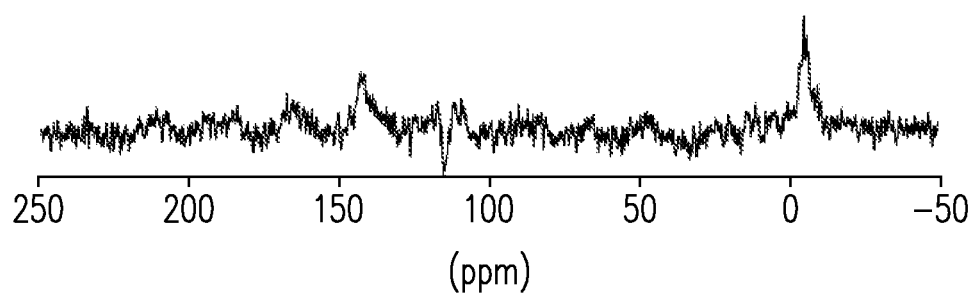

FIG. 6a is a $^{13}C$ single pulse MAS (i.e., SP-MAS) spectrum showing background signal data obtained while collecting measurements of natural abundance supercritical $CO_2$ ($scCO_2$) with the 9.5 mm (O.D.) high-pressure MAS rotor at a pressure of 130 bar, a temperature of 50° C., and a sample spinning rate of 1.7 kHz. The spectrum was acquired without $^1H$ high power decoupling (HPDEC) to minimize contributions to the background signal stemming from plastic device components (e.g., bushings) present in the high-pressure rotor. A total of 1600 scans (accumulations) and a recycle delay time of 1 second were employed. A Lorentz line broadening of 40 Hz was applied before Fourier transformation. Without line broadening, the linewidth of the $^{13}$C peak in the figure (located at about 126.0 ppm) is about 15.6 Hz. As shown in the figure, minimal background signals were observed. And, a background signal peak (centered at about −2 ppm) arising from VITON® O-rings used in the rotor has a low intensity as shown in the inset spectrum (expanded 32×) between −50 ppm and 50 ppm. FIG. 6b is a $^{13}$C SP-MAS spectrum showing background signal data obtained with the 9.5 mm (O.D.) high-pressure MAS rotor following release of pressurized $CO_2$ from the sample cell. Data were acquired at a temperature of 50° C., and a sample spinning rate of 1.7 kHz. In the figure, $^1$H high power decoupling was applied to show actual background signal intensities arising from individual plastic device components (e.g., bushings, end plugs, valve, and valve adaptor) and/or $CO_2$ penetration in the high-pressure rotor (described previously in reference to FIGS. 1 and 2). Number of scans (accumulations) was 7200. A recycle delay of 2 seconds was used. Results show low background signals ($^{13}$C) are achieved by eliminating signals arising from plastic components in the high pressure rotor in concert with the RF Saddle coil (see FIG. 6a). Further, background signals from individual components are weak despite a large number of scans. These data further show that a good localization is achieved. Further suppression of the background signal can be achieved with improved RF localization, e.g., in concert with RF shields (see discussion FIG. 6b) positioned at both ends of the RF Saddle Coil as described previously herein.

Gas Leakage at High Pressure

Figure 7A:
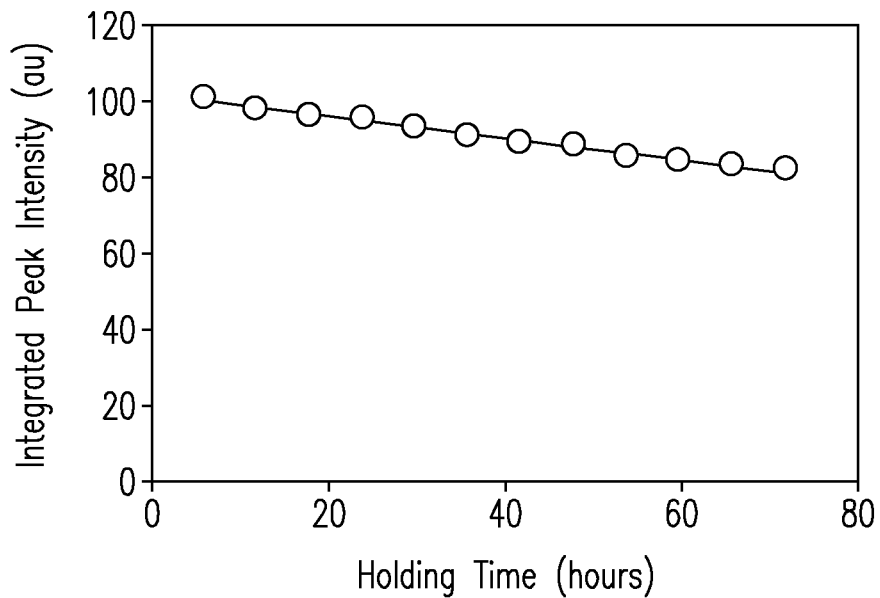
FIGS. 7a-7b present $^{13}C$ SP-MAS peak intensity data for measurement of $CO_2$ as a function of holding time acquired in situ with one embodiment of the invention.
Figure 7B:
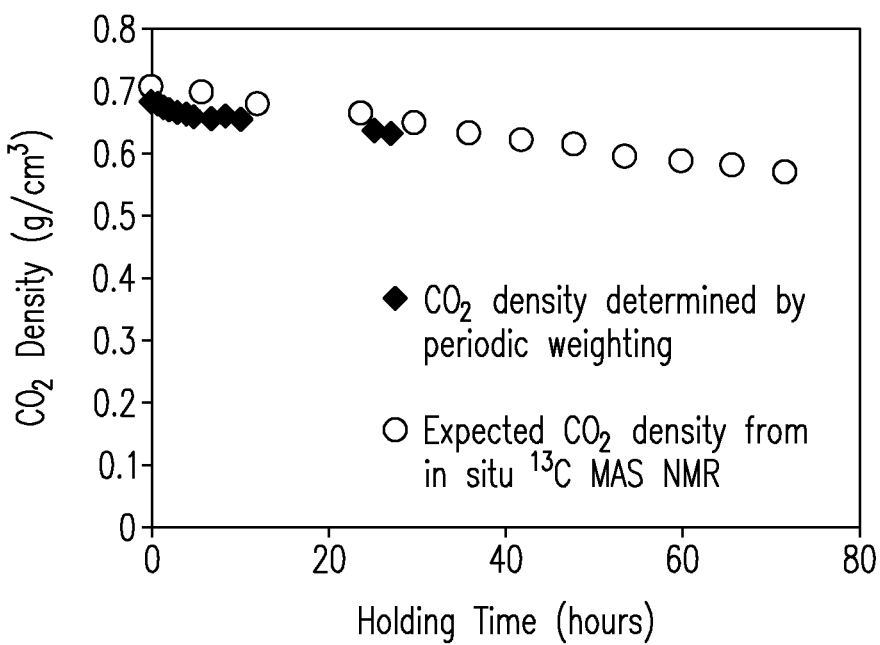

In exemplary tests, escape (i.e., leakage) of high pressure $CO_2$ from the high pressure rotor was measured over time. FIG. 7a plots integrated $^{13}$C peak intensity of supercritical $CO_2$ (sc$CO_2$) at 50° C. (323 K) as a function of holding time. Sample spinning rate was 1.64 kHz. Initial sc$CO_2$ pressure in the sample rotor was 150 bar. Peak position of sc$CO_2$ is centered at 125.96 ppm. In the figure, signal decay is approximately linear with time. Results show about 81.4% of peak intensity remains even after a holding time of 72 hours at 50° C. Integrated intensity of the $CO_2$ peak is directly proportional to the $CO_2$ density inside the fixed volume sample cell of the high-pressure rotor. Thus, density of $CO_2$ as a function of holding time at temperature (e.g., 323 K) can be determined by multiplying percentage of $CO_2$ peak intensity remaining with the initial $CO_2$ density (0.70 g/cm$^3$). Results show a pressure exceeding 150 bar is achieved with minimal penetration loss of pressure over at least a period of 72 hours. FIG. 7b plots expected $CO_2$ densities calculated from in situ $^{13}$C MAS NMR measurement data in the sample cell of the high-pressure MAS rotor as a function of holding time. $CO_2$ density data were estimated by periodically weighing the high-pressure MAS rotor over a period of 27 hours. In the figure, density data are included for comparison with expected values obtained from in situ measurements.

Density data closely match the in situ $^{13}$C MAS experimental data, confirming their veracity. Given an initial $CO_2$ density of 0.241304 g/cm$^3$ at 83 bar and 323 K, if the integrated $^{13}$C NMR $CO_2$ peak intensity is greater than 79% of the initial integrated peak intensity, $CO_2$ inside the high-pressure MAS rotor remains supercritical. Chemical shift values for the $CO_2$ peak showed the peak center positioned at 125.96 ppm did not change over the same period. The stable peak position confirms that the high-pressure MAS rotor is able to maintain $CO_2$ fluid above the supercritical point for at least 72 hours, starting from a pressure slightly above the critical point.

Figure 8:
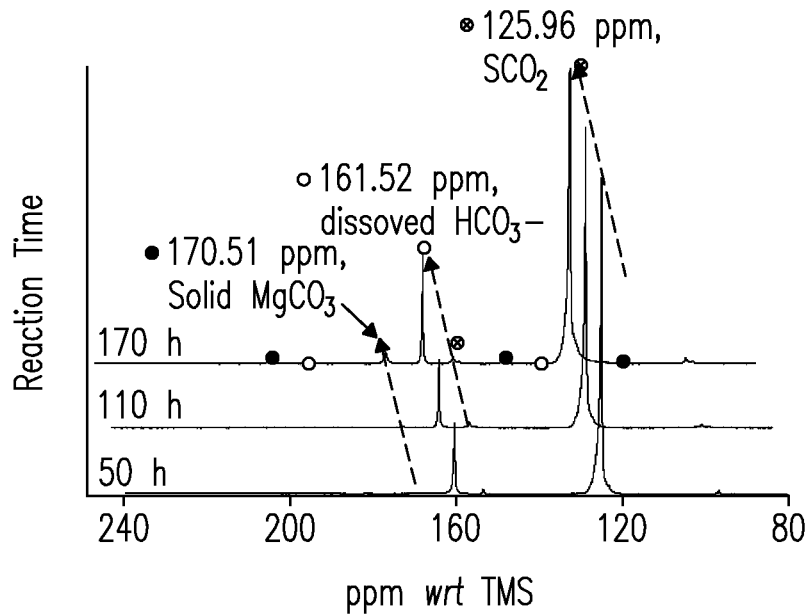
FIG. 8 presents $^{13}C$ SP-MAS NMR spectra for reaction of forsterite powder as a function of time acquired in situ with one embodiment of the invention.

FIG. 8 shows in-situ $^{13}$C SP-MAS NMR spectra acquired with one embodiment of the invention obtained for the reaction between sc$CO_2$ and an exemplary mineral, Forsterite (Mg$_2$SiO$_4$), as a function of reaction time. Data were acquired in-situ at a pressure of 150 bar and 50° C. over a period of 237 hours. Sample spin rate was 2.1 kHz. Number of accumulations (scans) was 26000 with a recycle delay of 2 seconds. TABLE 1 lists reaction times for the experiment.

TABLE 1

Reaction times for in-situ experiment.

| Reaction Time inside HP-RLRC (hours) | Re-Equilibration (hours)$^a$ | Acquisition Time (hours)$^b$ | Total Time (hours) |
|---|---|---|---|
| 50 | — | 17 | 67 |
| 60 | 1.5 | 25 | 154 |
| 60 | 1.5 | 22 | 237 |

$^a$Re-equilibration time represents a time window beginning from when a previous NMR acquisition is stopped until the rotor valve is opened inside the HP-RLRC. In the present experiment, the valve was opened in the HP-RLRC at a fluid pressure/temperature of 150 bar and 50° C., but is not limited.
$^b$Acquisition time represents the time needed to collect $^{13}$C MAS NMR spectra in the NMR spectrometer.

At a reaction time of 67 hours, the figure shows a sc$CO_2$ peak (centered at 125.96 ppm) and a $HCO_3^-$ peak (about 161 ppm). At a reaction time of 53.5 hours, a third peak appears in the spectrum (centered at 170 ppm) corresponding to MgCO$_3$. At a reaction time of 237 hours, intensity of the MgCO$_3$ peak increases. These time series measurements show that reaction intermediate species can be detected in-situ. For example, the peak corresponding to $HCO_3^-$ appears before the MgCO$_3$ peak is observed, indicating $HCO_3^-$ to be a reaction intermediate in this reaction system. Further, $HCO_3^-$ appears prior to any metal carbonate reaction products. Chemical shift values of $HCO_3^-$ and $H_2CO_3$ are located at 161.2 ppm and 162.9 ppm, respectively. With confidence the 161.52 ppm peak is assigned to $HCO_3^-$.

Figure 9:
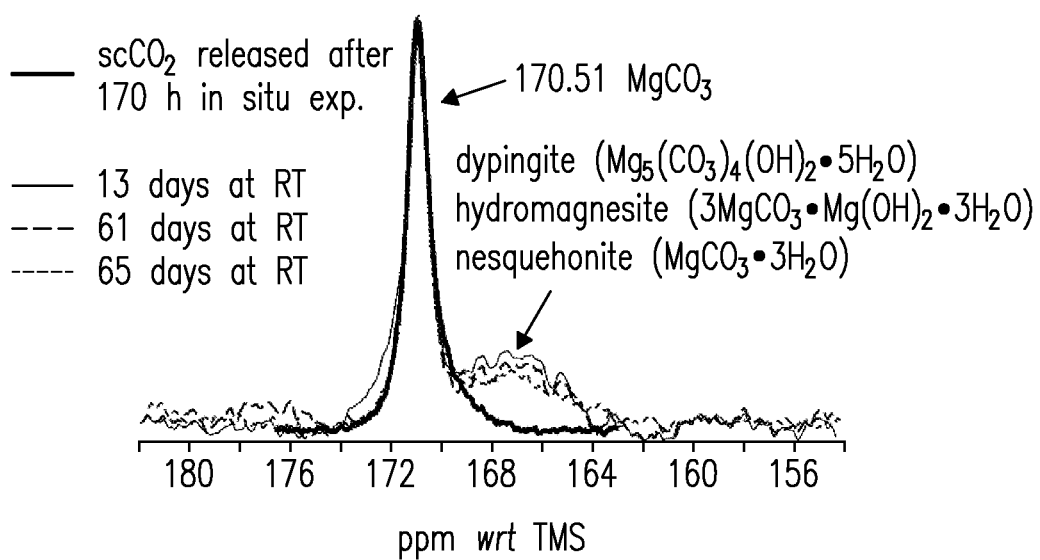
FIG. 9 presents $^{13}$C MAS NMR spectra for reaction of forsterite powder acquired ex situ with one embodiment of the invention.

After completing in-situ measurements (described previously in reference to FIG. 8), $^{13}$C MAS spectra were acquired ex-situ on the previously reacted Forsterite (Mg$_2$SiO$_4$) sample following release of sc$CO_2$ at room temperature and atmospheric pressure. Pressure in the sample cell was released by opening the rotor valve (FIG. 1 and FIG. 2) and then resealing the valve. FIG. 9 presents $^{13}$C MAS NMR spectra acquired ex-situ for the resulting mineral system as a function of time. Sample spin rate was 2.1 kHz. Number of scans was 165000 for the 61 day spectrum, 192000 for the 63 day spectrum, and 220000 for the 65 day spectrum, respectively. The first trace (time=0) was acquired following completion of in-situ experiments immediately after releasing sc$CO_2$. In the figure, sample contents include a mixture of newly formed MgCO$_3$ (as confirmed by the MgCO$_3$ peak at 170 ppm) formed by reaction with $CO_2$ during in-situ experiments and the remaining quantity of Forsterite (Mg$_2$SiO$_4$). Scans performed at 61 days, 63 days, and 65 days show the appearance and increase of hydration products such as magnesite, nesquehonite, and dypingite. Results show a metal carbonation reaction in a geological carbon sequestration related application. These data highlight the value of a high pressure MAS capability, which allows investigation of experimental conditions in various systems in-situ ("real conditions") by MAS NMR.

While a number of embodiments of the present invention have been shown and described, it will be apparent to those skilled in the art that many changes and modifications may be made without departing from the invention in its broader aspects. The appended claims are therefore intended to cover all such changes and modifications as fall within the scope of the invention.

What is claimed is:

1. A MAS rotor device, comprising:
    a rotor sleeve comprising at least one bushing disposed at an end adjacent a threaded surface along the inner wall defining a high-pressure sample cell that spans the inner diameter of the rotor sleeve; and
    a threaded sealing valve that secures to a valve adapter secured in one of the at least one bushings configured to seal a sample within the sample cell preventing sample release at high sample cell pressures at least above 1 bar.

2. The rotor device of claim 1, wherein the rotor sleeve comprises dual sealing bushings disposed above and below the sample cell defining upper and lower boundaries thereof.

3. The rotor device of claim 1, wherein the at least one sealing bushing is secured with a high-pressure adhesive to threads or grooves disposed along the inner wall above or below the sample cell within the rotor sleeve.

4. The rotor device of claim 1, wherein the rotor sleeve does not include a sample cell insert.

5. The rotor device of claim 1, wherein the rotor sleeve comprises a ceramic.

6. The rotor device of claim 1, further comprising a drive tip disposed at an end of the rotor sleeve for rotation of said rotor.

7. The rotor device of claim 1, wherein the threaded sealing valve prevents sample release from the sample cell at internal sample cell pressures greater than or equal to 1 bar.

8. The rotor device of claim 1, wherein the threaded sealing valve cap prevents sample release from the sample cell at internal sample cell pressures between 1 bar and 70 bar.

9. The rotor device of claim 1, wherein the threaded sealing valve cap prevents sample release from the sample cell at sample cell pressures greater than 70 bar.

10. The rotor device of claim 1, wherein the threaded sealing valve cap prevents sample release from the sample cell at sample cell pressures greater than 150 bar.

11. The rotor device of claim 1, further including an RF coil with RF shields disposed at respective ends of the rotor sleeve that delivers a localized $B_1$ field that minimizes background signals arising from the at least one sealing bushing within the rotor sleeve.

12. The rotor device of claim 1, wherein the sealing cap defines a needle channel for introducing samples into the sample cell or retrieving samples therefrom.

13. A MAS rotor device for analysis of samples at high sample pressures, comprising:
    a rotor sleeve defining a sample cell that spans the inner diameter of the rotor sleeve with at least one threaded bushing disposed at an end adjacent a threaded surface along the inner wall; and
    a threaded sealing cap that secured in one of the at least one bushings seals the sample cell preventing sample release therefrom at sample cell pressures at least up to about 70 bar.

14. A MAS rotor device for analysis of samples at high sample pressures, comprising:
    a rotor sleeve defining a sample cell that spans the inner diameter of the rotor sleeve with at least one threaded bushing disposed at an end adjacent a threaded surface along the inner wall; and
    a threaded sealing cap comprising a driving tip head secured in one of the at least one bushings sealing a sample within the sample cell preventing sample release at internal sample cell pressures at least up to about 70 bar and providing rotation of said rotor from a single end thereof.

15. A method, comprising:
    spinning a sample at the magic angle within a high-pressure sample cell defined within a ceramic rotor sleeve spanning the inner diameter therein that is sealed with a threaded sealing cap secured within the rotor sleeve above the sample cell therein to analyze the sample therein in situ at high sample cell pressures above 1 bar without release of sample therefrom.

16. The method of claim 15, wherein the spinning step is performed at internal sample cell pressures above 1 bar to about 70 bar.

17. The method of claim 15, wherein the spinning step is performed at internal sample cell pressures greater than 70 bar.

18. The method of claim 15, wherein the spinning step is performed at internal sample cell pressures greater than 150 bar.

19. The method of claim 15 wherein the threaded sealing cap is secured within the rotor sleeve using at least one threaded bushing disposed above the sample cell therein.

20. The method of claim 15 wherein the threaded sealing cap includes a driving tip head and the spinning step includes rotating the rotor sleeve from a single end thereof using the driving tip head.

21. A MAS rotor device for sample analyses at high sample pressures in-situ, comprising:
    a ceramic rotor sleeve defining a sample cell that spans the inner diameter therein and a threaded channel disposed above the sample cell; and
    a threaded sealing cap that secured in the threaded channel within the rotor sleeve seals the sample cell providing sample containment without sample release at sample cell pressures at least up to about 70 bar.

22. The rotor device of claim 21, wherein the sealing cap includes a driving tip head for rotation of said rotor from a single end thereof.

* * * * *

UNITED STATES PATENT AND TRADEMARK OFFICE
CERTIFICATE OF CORRECTION

PATENT NO. : 9,835,698 B2
APPLICATION NO. : 14/165215
DATED : December 5, 2017
INVENTOR(S) : David W. Hoyt et al.

It is certified that error appears in the above-identified patent and that said Letters Patent is hereby corrected as shown below:

On the Title Page

Item (56) References Cited:

Replace "Janssen, H. et al., Microcoil High-Resolution Magic Angle Spinning MMR Spectroscopy, J. Am. Chem. Soc., 128, 2006, 8722-8723."
With --Janssen, H. et al., Microcoil High-Resolution Magic Angle Spinning NMR Spectroscopy, J. Am. Chem. Soc., 128, 2006, 8722-8723.--

Replace "Purcell, E. M., et al., Resonance Absorption by Nuclear Magnetic Moments in a a Solid, Phys. Rev. 29, 1946, p. 37."
With --Purcell, E. M., et al., Resonance Absorption by Nuclear Magnetic Moments in a Solid, Phys. Rev. 69, 1946, p. 37.--

Replace "Andrew, E. R., et al., Nuclear Magnetic Resonance Spectra from a Crystal rotated at High Speed, Nature 182, 1959."
With --Andrew, E. R., et al., Nuclear Magnetic Resonance Spectra from a Crystal rotated at High Speed, Nature 182, 1958.--

Replace "Miyoshi, T., et al., 13C High-Pressure CPMAS NMR Characterization of the Molecular Motion of Polystyrene Plasticized by CO2 Gas, Macromolecules, 30, 1997, 6582-6586."
With --Miyoshi, T., et al., 13C High-Pressure CPMAS NMR Characterization of the Molecular Motion of Polystyrene Plasticized by CO2 Gas, Macromolecules, 30, 1997, 6582-6585.--

Replace "Rasul, G., et al., Carbonic Acid and Its Mono- and Diprotonation: NMR, ab Inito, and IGLO Investigation, J. Am. Chem. Soc., 115, 1993, 2235-2238."
With --Rasul, G., et al., Carbonic Acid and Its Mono- and Diprotonation: NMR, ab Inito, and IGLO Investigation, J. Am. Chem. Soc., 115, 1993, 2236-2238.--

Signed and Sealed this
Seventh Day of August, 2018

Andrei Iancu
*Director of the United States Patent and Trademark Office*

Replace "WO PCT/US2011/052604 Search Rept, dated Mar. 27, 2013, Battelle Memorial Institute."
With --WO PCT/US2011/052604 Search Rept, dated Mar. 27, 2012, Battelle Memorial Institute.--

Replace "WO PCT/US2011/052604 Writ Opin, dated Mar. 27, 2013, Battelle Memorial Institute."
With --WO PCT/US2011/052604 Writ Opin, dated Mar. 27, 2012, Battelle Memorial Institute.--